United States Patent
Nishita et al.

(10) Patent No.: US 12,044,968 B2
(45) Date of Patent: Jul. 23, 2024

(54) PROTECTIVE FILM-FORMING COMPOSITION HAVING ACETAL STRUCTURE AND AMIDE STRUCTURE

(71) Applicant: NISSAN CHEMICAL CORPORATION, Tokyo (JP)

(72) Inventors: Tokio Nishita, Toyama (JP); Takafumi Endo, Toyama (JP); Yuki Endo, Toyama (JP); Takahiro Kishioka, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 489 days.

(21) Appl. No.: 17/311,965

(22) PCT Filed: Jan. 20, 2020

(86) PCT No.: PCT/JP2020/001627
§ 371 (c)(1),
(2) Date: Jun. 8, 2021

(87) PCT Pub. No.: WO2020/153278
PCT Pub. Date: Jul. 30, 2020

(65) Prior Publication Data
US 2022/0026806 A1 Jan. 27, 2022

(30) Foreign Application Priority Data
Jan. 21, 2019 (JP) ................. 2019-007857

(51) Int. Cl.
| | |
|---|---|
| G03F 7/11 | (2006.01) |
| C08F 212/14 | (2006.01) |
| C08F 220/28 | (2006.01) |
| C09D 125/18 | (2006.01) |
| C09D 133/14 | (2006.01) |
| H01L 21/027 | (2006.01) |

(52) U.S. Cl.
CPC .............. *G03F 7/11* (2013.01); *C08F 212/22* (2020.02); *C08F 220/282* (2020.02); *C09D 125/18* (2013.01); *C09D 133/14* (2013.01); *H01L 21/0273* (2013.01)

(58) Field of Classification Search
CPC .......... G03F 7/11; G03F 7/094; C08F 212/22; C08F 220/282; C08F 212/32; C08F 220/10; C08F 220/34; C08F 220/56; C08F 220/58; C08F 220/365; C09D 125/18; C09D 133/14; H01L 21/0273; H01L 21/0332
See application file for complete search history.

(56) References Cited

U.S. PATENT DOCUMENTS

| | | | |
|---|---|---|---|
| 6,579,657 B1 * | 6/2003 | Ishibashi | H01L 21/0271 430/300 |
| 2010/0040975 A1 * | 2/2010 | Wada | G03F 7/0045 430/326 |
| 2013/0143163 A1 * | 6/2013 | Hatakeyama | C09D 125/18 524/378 |
| 2016/0202612 A1 * | 7/2016 | Hatakeyama | C08F 212/20 430/296 |
| 2017/0153547 A1 * | 6/2017 | Sim | H01L 21/02282 |
| 2017/0283651 A1 | 10/2017 | Sim et al. | |
| 2020/0201184 A1 * | 6/2020 | Ogata | C08G 65/3344 |

FOREIGN PATENT DOCUMENTS

| | | | |
|---|---|---|---|
| JP | S61-121050 A | 6/1986 | |
| JP | 2008-209889 A | 9/2008 | |
| JP | 2017-107185 A | 6/2017 | |
| JP | 2017-187764 A | 10/2017 | |
| WO | 2010/104074 A1 | 9/2010 | |
| WO | WO-2010104074 A1 * | 9/2010 | ............. G03F 7/091 |
| WO | 2014/126088 A1 | 8/2014 | |
| WO | WO-2014126088 A1 * | 8/2014 | ............. G03F 7/038 |
| WO | 2018/203540 A1 | 11/2018 | |
| WO | WO-2018203540 A1 * | 11/2018 | ........... C08G 59/302 |

OTHER PUBLICATIONS

Ogata, WO-2018203540-A1, Machine Translation (Year: 2023).*
Kishioka et al. WO-2010104074-A1, Machine Translation (Year: 2023).*
Matsuda, WO-2014126088-A1, Machine Translation (Year: 2023).*
The U.S. Appl. No. 16/605,246, filed Oct. 15, 2019 in the name of Hiroto Ogata et al.
Mar. 24, 2020 Search Report issued in International Patent Application No. PCT/JP2020/001627.
Jun. 16, 2021 International Preliminary Report on Patentability issued in International Patent Application No. PCT/JP2020/001627.

* cited by examiner

*Primary Examiner* — Duy Vu N Deo
*Assistant Examiner* — Christopher Remavege
(74) *Attorney, Agent, or Firm* — Oliff PLC

(57) ABSTRACT

A composition for forming a protective film having excellent resistance to a wet etching solution for semiconductors during a lithographic process in the manufacture of semiconductors; a method of forming a resist pattern using said protective film; and a method for manufacturing a semiconductor device. This composition for forming a protective film against a wet etching solution for semiconductors includes: a compound or polymer which contains at least one among an acetal structure and an amide structure; and a solvent. The polymer is preferably a copolymer of: a compound (a) containing at least one acetal structure in a molecule; and a compound (b) containing at least one amide structure in a molecule.

13 Claims, No Drawings

PROTECTIVE FILM-FORMING COMPOSITION HAVING ACETAL STRUCTURE AND AMIDE STRUCTURE

TECHNICAL FIELD

The present invention relates to a composition for forming a protective film which is highly resistant to a semiconductor wet etchant, preferably an acidic or basic aqueous hydrogen peroxide solution, in a lithography process in semiconductor manufacturing. The present invention also relates to the application of such a protective film to a resist pattern forming method and a semiconductor device manufacturing method.

BACKGROUND ART

In semiconductor manufacturing, a lithography process comprising providing a resist underlayer film between a substrate and a resist film to allow the desired shape of resist pattern to be transferred has widely been known.

Patent Literature 1 discloses an antireflective coating composition for use with an overcoated photoresist, comprising a polymer containing a glycidyl group and a polymer containing an aromatic group substituted with such a substituent as a hydroxy group; and a method comprising forming a photoresist underlayer film from the composition, exposing the photoresist with light, and developing the same to form a pattern.

Patent Literature 2 discloses a method for forming a photoresist relief image, comprising applying on a substrate a composition containing a resin containing an epoxy reactive group such as a hydroxy group and a crosslinker resin containing an epoxy group, and forming a photoresist layer on the composition layer.

CITATION LIST

Patent Literature

Patent Literature 1: JP 2017-107185 A
Patent Literature 2: JP 2017-187764 A

SUMMARY OF INVENTION

Technical Problem

When a substrate is wet etched through a resist underlayer film as an etching mask, the resist underlayer film is required to exhibit a good masking function against the wet etchant during the processing of the underlying substrate.

As a means for exhibiting a resistance to SC-1 (ammonia-hydrogen peroxide solution), which is a type of wet etching chemicals, use of gallic acid as an additive has conventionally been carried out.

Further, catechol structures have been known effective in improving the resistance to semiconductor wet etchants (Patent Literature 1). However, the resistance to semiconductor wet etchants remains still unsatisfactory.

An object of the present invention is to solve the problems mentioned above.

Solution to Problem

Aspects of the present invention include the following.
[1] A protective film-forming composition for forming a protective film against a semiconductor wet etchant, the composition comprising a solvent, and a compound or polymer containing at least one acetal structure and at least one amide structure.
[2] The protective film-forming composition according to [1], wherein the polymer is a copolymer of a compound (a) containing at least one acetal structure in the molecule and a compound (b) containing at least one amide structure in the molecule.
[3] The protective film-forming composition according to [1] or [2], wherein the at least one acetal structure is a structure that protects adjacent hydroxy groups in an aromatic group.
[4] The protective film-forming composition according to any one of [1] to [3], wherein the compound (a) or the at least one acetal structure comprises a structure represented by formula (1):

[Chem. 1]

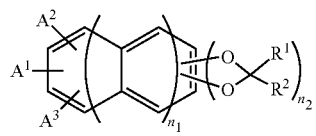

formula (1)

(in formula (1),
$R^1$ and $R^2$ are the same as or different from each other and are each a hydrogen atom, or a C1-C10 alkyl or C6-C40 aryl group optionally substituted with a monovalent organic group (A),
$n_1$ is 0, 1 or 2,
$n_2$ is 1 or 2,
$A^1$ denotes a hydrogen atom or a hydroxy group,
$A^2$ denotes a —CH($R^0$)-$A^4$ group,
$R^0$ denotes a hydrogen atom, a phenyl group optionally substituted with 1 to 3 hydroxy groups, or a benzodioxole group, and
$A^3$ and $A^4$ each denote an identical or different monovalent organic group (A-1)).
[5] The protective film-forming composition according to [1] or [2], wherein the compound (b) or the at least one amide structure comprises a structure represented by —CO—NH— or —CO—N=.
[6] The protective film-forming composition according to [2], wherein the compound (b) is represented by formula (2):

[Chem. 2]

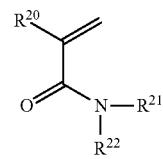

formula (2)

(in formula (2), $R^{20}$ denotes a hydrogen atom or a methyl group, and $R^{21}$ and $R^{22}$ are the same as or different from each other and are each a hydrogen atom, or a C1-C10 alkyl or C6-C40 aryl group optionally substituted with a monovalent organic group (B) and optionally interrupted by an oxygen atom or a quaternary ammonium cation).

[7] The protective film-forming composition according to [6], wherein the monovalent organic group (B) is selected from the group consisting of a hydroxy group, a cyano group, a sulfo group, a carboxylate group, a boron atom optionally substituted with one or two hydroxy groups, an optionally halogenated C1-C6 alkyl group, and an —NR$^{a1}$R$^{b1}$ group (wherein R$^{a1}$ and R$^{b1}$ are the same as or different from each other and each denote a hydrogen atom or a C1-C3 alkyl group).

[8] The protective film-forming composition according to [2], wherein the compound (b) is represented by formula (2-1):

[Chem. 3]

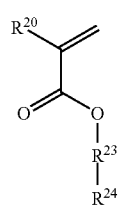

formula (2-1)

(in formula (2-1), R$^{20}$ denotes a hydrogen atom or a methyl group, R$^{23}$ denotes a C1-C5 alkylene group, and R$^{24}$ denotes a blocked isocyanate group).

[9] The protective film-forming composition according to any one of [1] to [8], further comprising a crosslinking catalyst.

[10] The protective film-forming composition according to any one of [1] to [9], further comprising a crosslinking agent.

[11] The protective film-forming composition according to any one of [1] to [10], further comprising a surfactant.

[12] A protective film, which is a calcined product of a coating film comprising the protective film-forming composition according to any one of [1] to [11].

[13] A method for producing a resist-patterned substrate, which is used for manufacture of a semiconductor, comprising applying the protective film composition according to any one of [1] to [11] onto a semiconductor substrate and calcining the composition to form a protective film as a resist underlayer film.

[14] A method for manufacturing a semiconductor device, comprising
forming a protective film against a semiconductor wet etchant with the protective film-forming composition according to any one of [1] to [11] on a semiconductor substrate optionally having an inorganic film formed on a surface thereof,
forming a resist pattern on the protective film,
dry-etching the protective film through the resist pattern as a mask to expose a surface of the inorganic film or of the semiconductor substrate,
wet-etching the inorganic film or the semiconductor substrate with a semiconductor wet etchant through the dry-etched protective film as a mask, and cleaning the semiconductor substrate.

Advantageous Effects of Invention

The protective film-forming compositions of the present invention exhibit high resistance to a semiconductor wet etchant attributable to including a compound or polymer containing at least one acetal structure and at least one amide structure.

DESCRIPTION OF EMBODIMENTS

Protective Film-Forming Compositions

The protective film-forming composition of the present invention is a protective film-forming composition for forming a protective film against a semiconductor wet etchant, the composition comprising a solvent, and a compound or polymer containing at least one acetal structure and at least one amide structure.

Of the compound or polymer containing at least one acetal structure and at least one amide structure, a polymer containing at least one acetal structure and at least one amide structure is preferable.

The compound containing at least one acetal structure and at least one amide structure contains at least one acetal structure and at least one amide structure in the molecule.

The compound is preferably represented by the following formula (a1):

[Chem. 4]

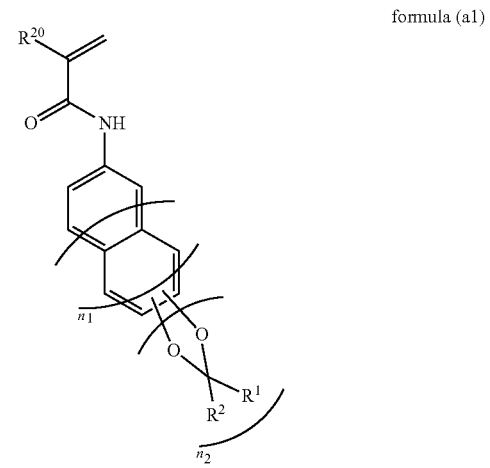

formula (a1)

(In formula (a1), R$^{20}$ denotes a hydrogen atom or a methyl group, R$^1$ and R$^2$ are the same as or different from each other and are each a hydrogen atom, or a C1-C10 alkyl or C6-C40 aryl group optionally substituted with a monovalent organic group (A), n$_1$ is 0, 1 or 2, and n$_2$ is 1 or 2.) Specific examples of the compounds include those represented by the following structural formulae.

[Chem. 5]

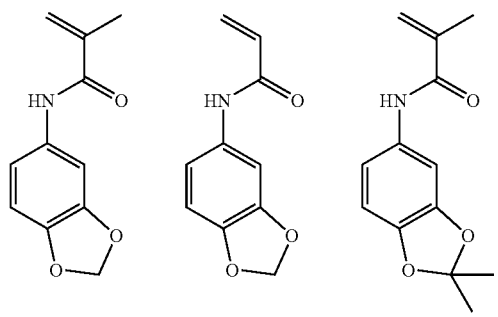

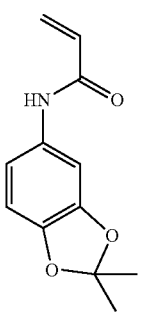

The polymer containing at least one acetal structure and at least one amide structure may contain one or more acetal structures and one or more amide structures, respectively, in a repeating unit of the polymer.

Such a repeating unit of the polymer is preferably represented by the following structural formula (a2).

[Chem. 6]

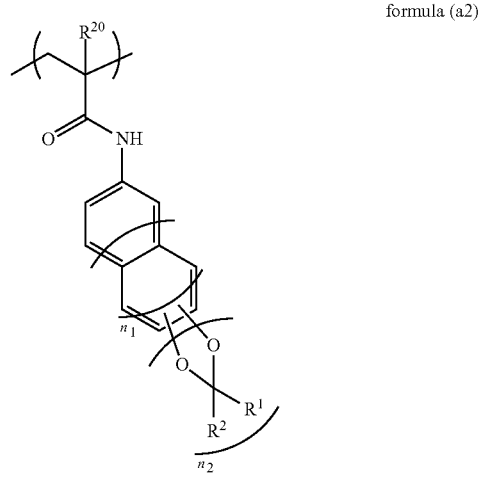

formula (a2)

(In formula (a2), $R^{20}$, $R^1$, $R^2$, $n_1$ and $n_2$ are the same as defined in formula (a1).)

Specific examples of such repeating units of the polymer include those represented by the following structural formulae.

[Chem. 7]

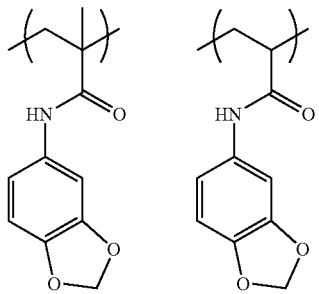

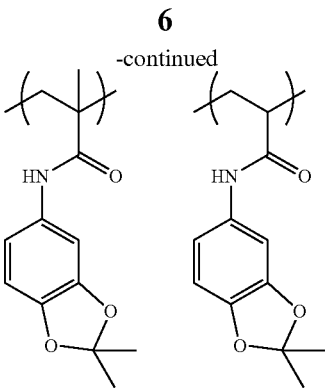

The polymer is preferably a copolymer containing a repeating unit having an acetal structure and a repeating unit having an amide structure. The polymer preferably comprises a copolymer from a compound (a) containing at least one acetal structure in the molecule and a compound (b) containing at least one amide structure in the molecule. These will be described sequentially below.

Compounds (a) Containing at Least One Acetal Structure in the Molecule

The acetal structure is preferably a structure that protects adjacent hydroxy groups in an aromatic group. In this case, the compound includes, in the molecule, at least one aromatic group of which the hydroxy groups adjacent to each other are protected with an acetal.

Such an acetal structure preferably comprises a structure represented by formula (1):

[Chem. 8]

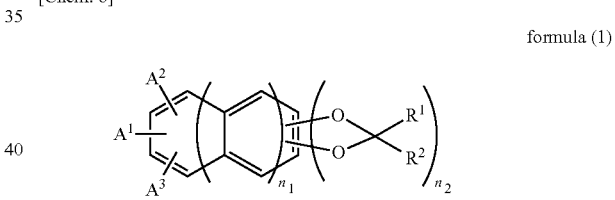

formula (1)

(In formula (1),
$R^1$ and $R^2$ are the same as or different from each other and are each a hydrogen atom, or a C1-C10 alkyl or C6-C40 aryl group optionally substituted with a monovalent organic group (A),
$n_1$ is 0, 1 or 2,
$n_2$ is 1 or 2,
$A^1$ denotes a hydrogen atom or a hydroxy group,
$A^2$ denotes a —CH($R^0$)-$A^4$ group,
$R^0$ denotes a hydrogen atom, a phenyl group optionally substituted with 1 to 3 hydroxy groups, or a benzodioxole group, and
$A^3$ and $A^4$ each denote an identical or different monovalent organic group (A-1).)

Examples of the C1-C10 alkyl group optionally substituted with a monovalent organic group (A) include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group and 2-ethyl-3-methyl-cyclopropyl group.

Examples of the C6-C40 aryl group optionally substituted with a monovalent organic group (A) include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group and 9-phenanthryl group.

Examples of the monovalent organic group (A) as substituents for these alkyl groups and aryl groups include, but are not limited to, halogen atoms (fluorine, chlorine, bromine, iodine), nitro groups, cyano groups, amino groups, hydroxy groups, carbonyl groups and carbonyloxy groups.

In formula (1), it is preferable that $n_1$ be 0 and $n_2$ be 1.

In formula (1), it is preferable that $R^1$ and $R^2$ be the same as or different from each other and be each a hydrogen atom or a methyl group. More preferably, $R^1$ and $R^2$ are both hydrogen atoms.

Monovalent Organic Group (A-1)

The monovalent organic group (A-1) are not particularly limited and may be a group derived from various polymers or oligomers or may be a group derived from low-molecular compounds. The monovalent organic group may be a group derived from a compound represented by formula (1). When, in particular, $A^4$ denotes a compound represented by formula (1), the structure is an oligomer or polymer in which identical or different compounds of formula (1) are connected via the —CH($R^0$)— group.

Monovalent Organic Group (A-1) Derived from Polymer

By adopting a polymer-derived organic group, control is possible of properties such as dry etching rate (thickness loss per unit time), attenuation coefficient and refractive index of a resist underlayer film formed from the protective film-forming composition of the present invention.

The polymer is not particularly limited, and numerous kinds of organic polymers may be used. For example, addition polymers, polycondensed polymers and ring-opened polymers, such as polyesters, polystyrenes, polyimides, acrylic polymers, methacrylic polymers, polyvinyl ethers, phenol novolaks, naphthol novolaks, polyethers, polyamides and polycarbonates may be used. Of these, acrylic polymers and methacrylic polymers are preferable.

Examples of such organic polymers include addition polymers containing structural units from addition-polymerizable monomers such as benzyl acrylate, benzyl methacrylate, phenyl acrylate, naphthyl acrylate, anthryl methacrylate, anthrylmethyl methacrylate, styrene, hydroxystyrene, benzyl vinyl ether and N-phenylmaleimide, and polycondensed polymers such as phenol novolaks and naphthol novolaks.

When an addition polymer is used as the organic polymer, the polymer may be a homopolymer or a copolymer. Such an addition polymer is produced using an addition-polymerizable monomer or monomers. Examples of the addition-polymerizable monomer include acrylic acid, methacrylic acid, acrylic acid ester compounds, methacrylic acid ester compounds, acrylamide compounds, methacrylamide compounds, vinyl compounds, styrene compounds, maleimide compounds, maleic anhydride and acrylonitrile.

Examples of the acrylic acid ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane and glycidyl acrylate.

Examples of the methacrylic acid ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate and bromophenyl methacrylate.

Examples of the acrylamide compound include acrylamide, N-methylacrylamide, N-ethylacrylamide, N-benzylacrylamide, N-phenylacrylamide, N,N-dimethylacrylamide and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene and vinylanthracene.

Examples of the styrene compound include styrene, hydroxystyrene, chlorostyrene, bromostyrene, methoxy styrene, cyanostyrene and acetylstyrene.

Examples of the maleimide compound include maleimide, N-methylmaleimide, N-phenylmaleimide, N-cyclohexylmaleimide, N-benzylmaleimide and N-hydroxyethylmaleimide.

When a polycondensed polymer is used as the polymer described hereinabove, the polymer may be, for example, a polycondensed polymer formed between a glycol compound and a dicarboxylic acid compound.

Examples of the glycol compound include diethylene glycol, hexamethylene glycol and butylene glycol.

Examples of the dicarboxylic acid compound include aliphatic dicarboxylic acids and aromatic dicarboxylic acids, such as succinic acid, 2,2-dimethylsuccinic acid, adipic acid, terephthalic acid, isophthalic acid, phthalic acid, 3,3'-dithiodipropionic acid, tartaric acid, malic acid and maleic anhydride.

Examples of the polymer further include polyesters, polyamides and polyimides, such as polypyromellitimide, poly(p-phenylene terephthalamide), polybutylene terephthalate and polyethylene terephthalate.

When a ring-opened polymer is used as the polymer described hereinabove, the polymer may be, for example, a polycondensed polymer formed between a diepoxy compound and a dicarboxylic acid compound.

Examples of the diepoxy compound include sorbitol polyglycidyl ether, polyglycerol polyglycidyl ether, pentaerythritol polyglycidyl ether, digylcerol polyglycidyl ether, glycerol polyglycidyl ether, trimethylolpropane polyglycidyl ether, neopentyl glycol diglycidyl ether and 1,6-hexanediol diglycidyl ether.

[Chem. 9]

[3-1]
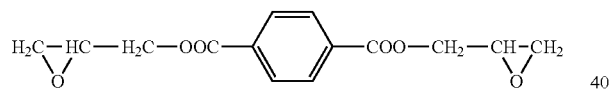

[3-2]
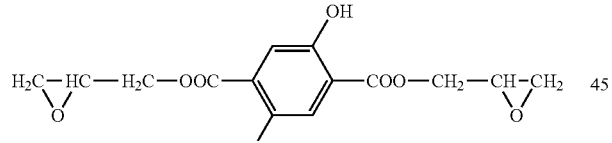

[3-3]
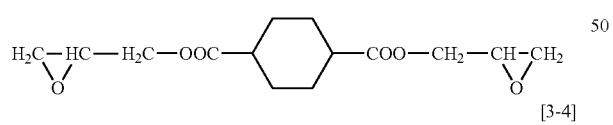

[3-4]
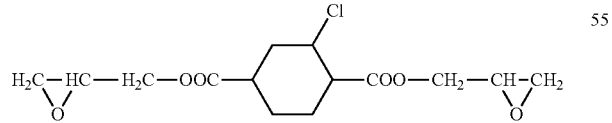

[3-5]
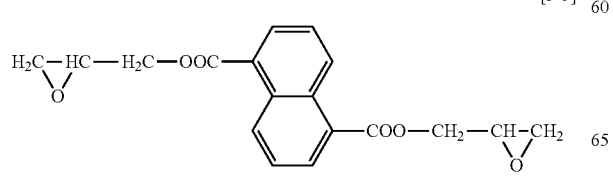

[3-6]
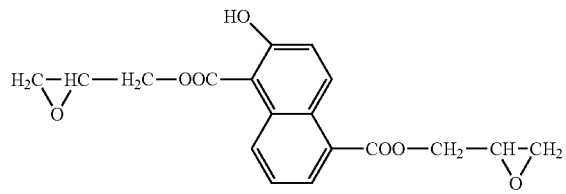

[3-7]
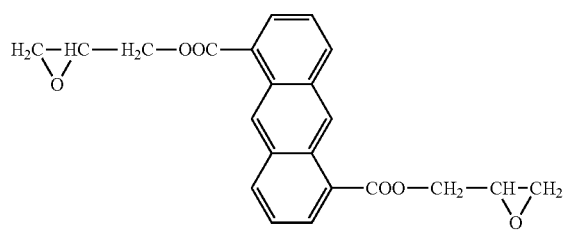

[3-8]
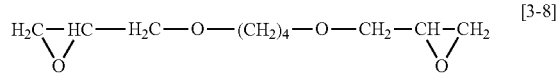

[3-9]
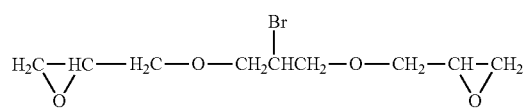

[Chem. 10]

[3-10]
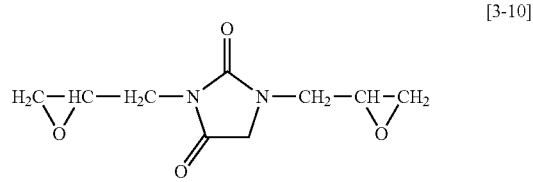

[3-11]
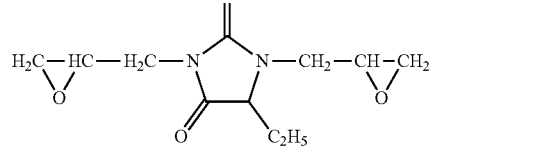

[3-12]
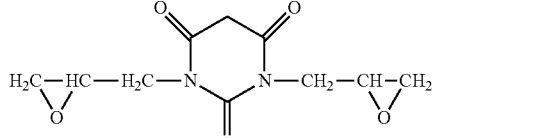

[3-13]
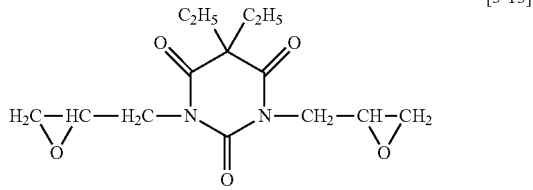

11
-continued

[3-14]

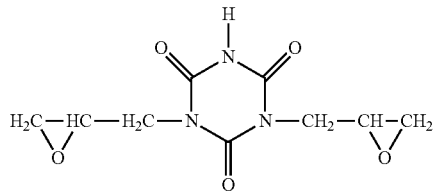

[3-15]

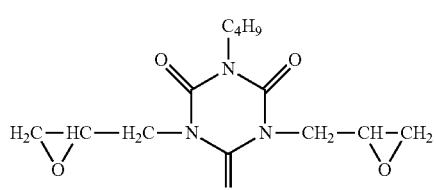

[3-16]

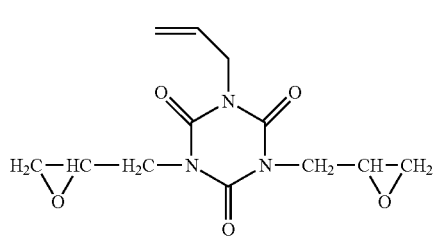

The compounds represented by the above [3-1] to [3-16] also constitute examples of the diepoxy compound.

Examples of the dicarboxylic acid compound include those dicarboxylic acid compounds described hereinabove.

12

Preferably, the polymer has a structure of formula (10):

[Chem. 11]

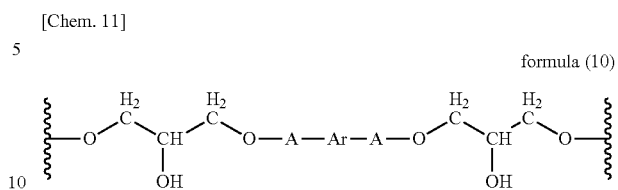

formula (10)

(In formula (10), A denotes a direct bond or —C(=O)—, and Ar denotes a benzene, naphthalene or anthracene ring optionally substituted with a C1-C6 alkyl group, a halogen atom, a hydroxy group, a carboxyl group, an amino group, a C1-C6 alkoxy group, a C1-C6 alkylthio group, a cyano group, an acetyl group, an acetyloxy group, a C1-C6 alkoxycarbonyl group, a nitro group, a nitroso group, an amide group, an imide group, a C1-C6 alkoxysulfonyl group or a sulfonamide group.)

Referring to formula (10), examples of the alkyl group include methyl group, ethyl group, n-butyl group, t-butyl group, isopropyl group and cyclohexyl group; examples of the halogen atom include fluorine atom, chlorine atom, bromine atom and iodine atom; examples of the alkoxy group include methoxy group, ethoxy group and butoxy group; examples of the alkylthio group include methylthio group, ethylthio group and butylthio group; examples of the alkoxycarbonyl group include methoxycarbonyl group, ethoxycarbonyl group and isopropoxycarbonyl group; and examples of the alkoxysulfonyl group include methoxysulfonyl group and ethoxysulfonyl group.

The copolymers described above may be produced by, for example, the methods described in Japanese Patent No. 5041175.

Monovalent Organic Group (A-1) Derived from Low-Molecular Compound

The low-molecular compound from which the monovalent organic group is derived is not particularly limited, but preferably has a molecular weight of not less than 300 in consideration of the risk of volatilization during calcination. The upper limit of the molecular weight is, for example, 999. Some preferred specific examples are shown below. The symbol * denotes a bonding site.

[Chem. 12]

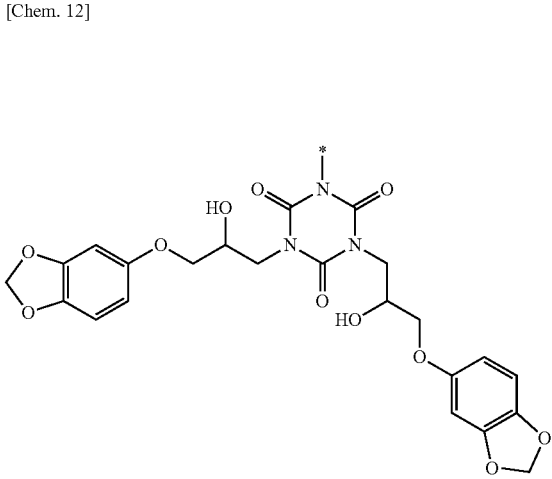

[Chem. 13]
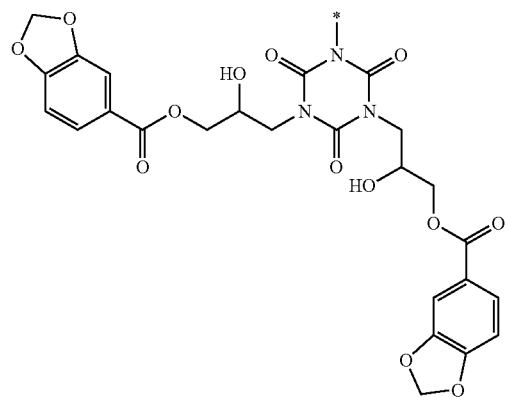
[Chem. 14]
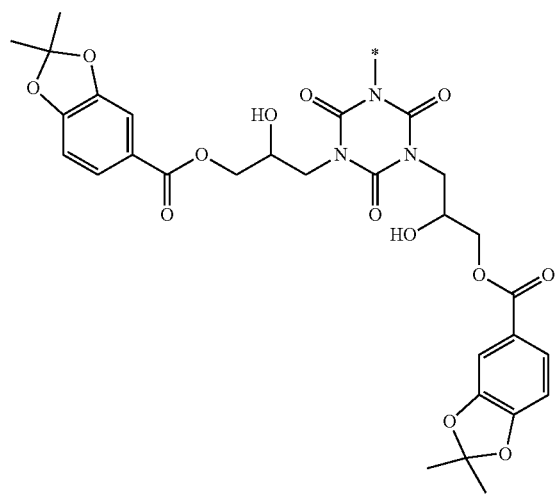
[Chem. 15]
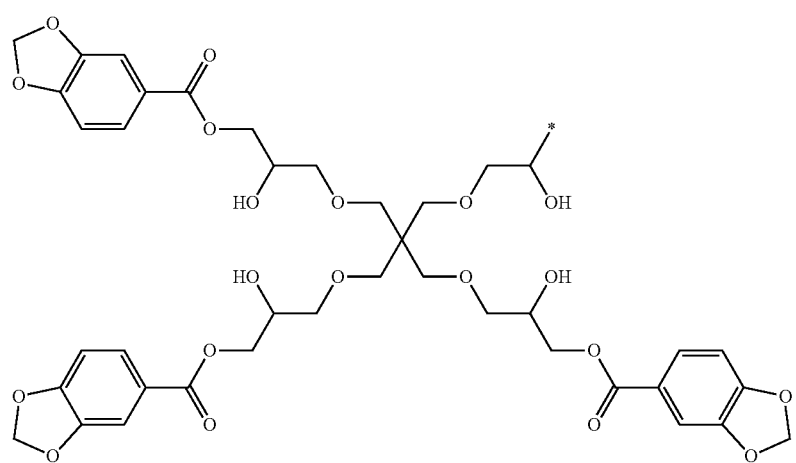

[Chem. 16]

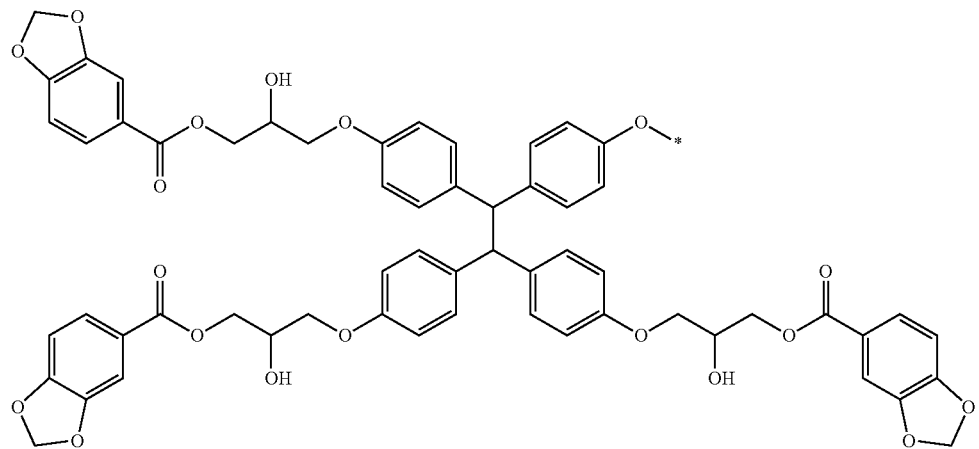

[Chem. 17]

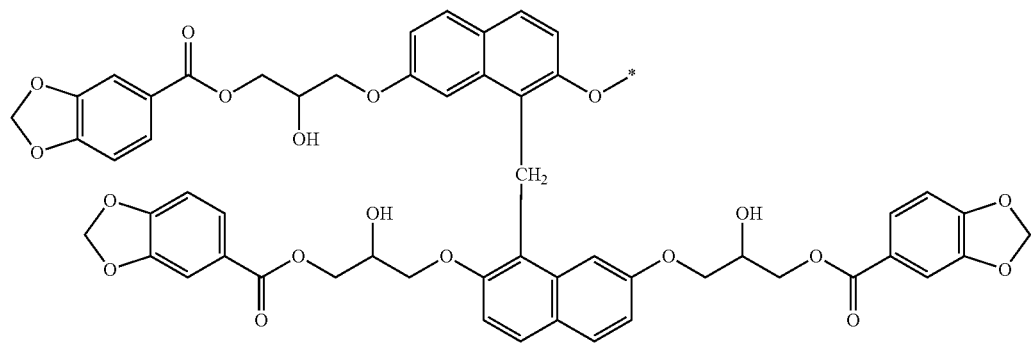

The monovalent organic group may be one of the above low-molecular compounds to which a spacer is combined.

For example, the spacer may be one or a combination of two or more of —CH—, —(CH$_2$)$_n$— (n=1 to 20), —CH=CH—, —C≡CH—, —N=N—, —NH—, —NHR—, —NHCO—, —NRCO—, —S—, —COO—, —O—, —CO—, —CH=N—, —CH(OH)— and phenylene. Two or more of these spacers may be connected.

Specific Examples of Preferred Compound Having Partial Structure Represented by Formula (1)

Examples of preferred compound having a partial structure represented by formula (1) are given hereinbelow.

For example, the polymer having a partial structure of formula (1) may include a structural unit represented by any of the following formulae (A-1) to (A-6).

[Chem. 18]

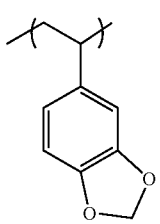

formula (A-1)

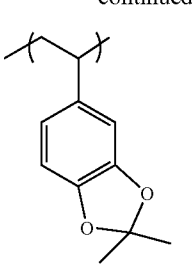

formula (A-2)

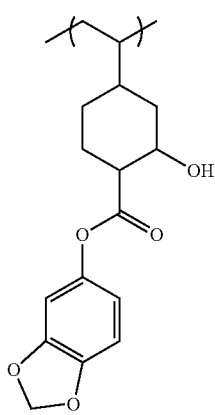

formula (A-3)

formula (A-4)

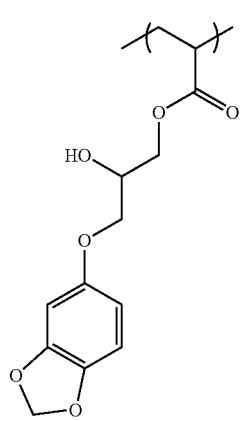

formula (A-5)

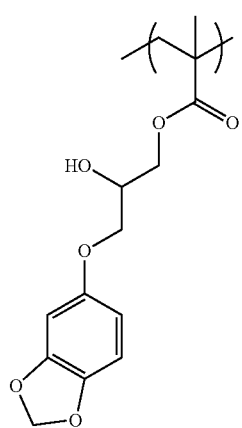

formula (A-6)

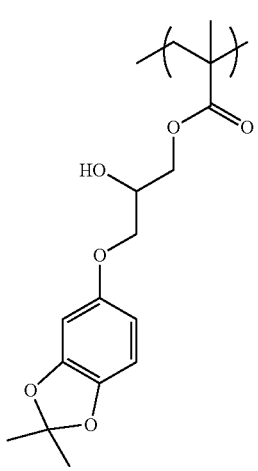

In the polymer having a partial structure represented by formula (1), the molar ratio of the unit structure having the partial structure of formula (1) is within the range of 10 to 85% by mole, 30 to 70% by mole, or 30 to 45% by mole of the whole copolymer. The copolymer may include a single, or two or more types of unit structure having a partial structure represented by formula (1).

Examples of the compound or polymer having a partial structure represented by formula (1) further include a reaction product (D) obtained from an epoxy compound or resin represented by any of the following formulae (B) and a proton-generating compound of any of the formulae (C) described later having a partial structure represented by formula (1).

Examples of the epoxy compound (B) include glycidyl ether compounds, glycidyl ester compounds, glycidyl group-containing isocyanurates, epoxycyclohexyl compounds, epoxy group-substituted cyclohexyl compounds, and resins thereof. Examples of the epoxy compound (B) which may be used in the present invention include the following.

[Chem. 19]

formula (B-1)

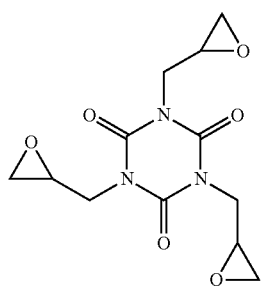

formula (B-2)

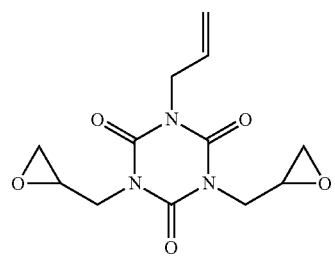

formula (B-3)

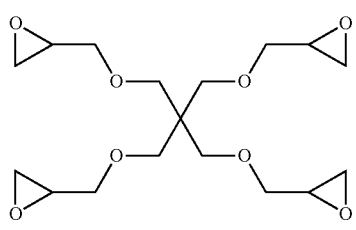

formula (B-4)

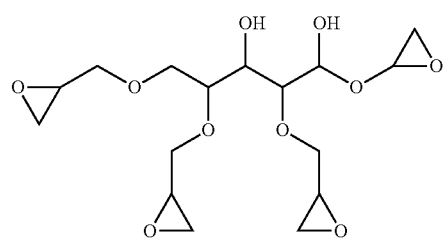

-continued
formula (B-5)
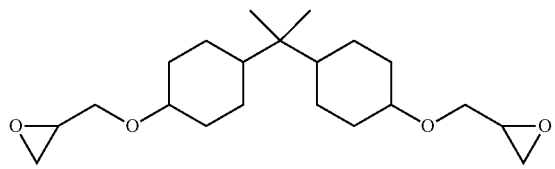
formula (B-6)
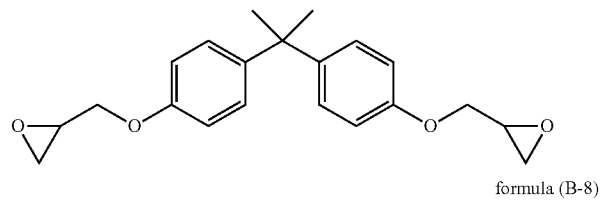
formula (B-7)
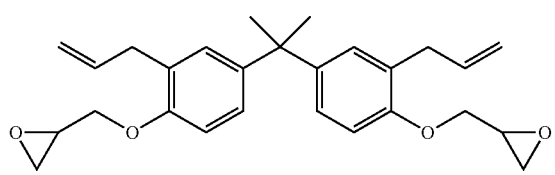
formula (B-8)
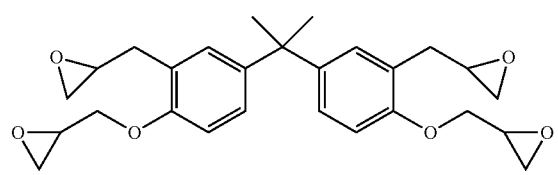
formula (B-9)
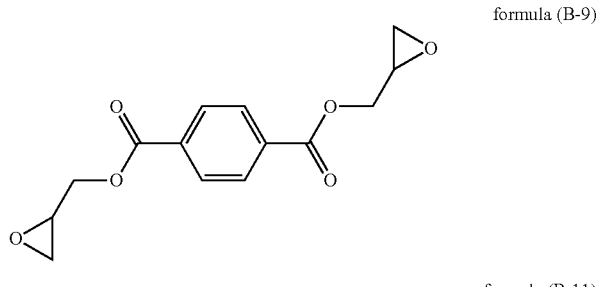
formula (B-10)
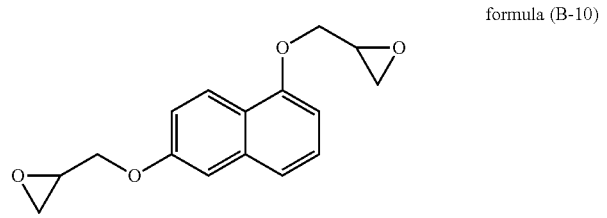
formula (B-11)
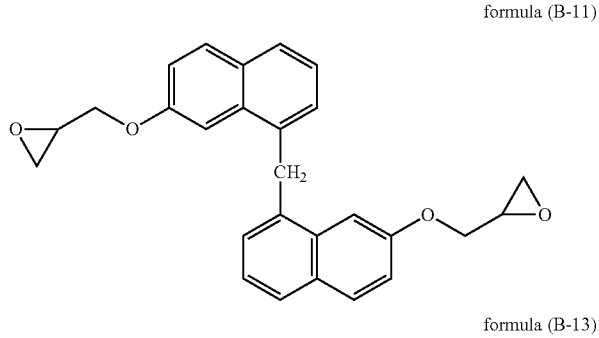
formula (B-12)
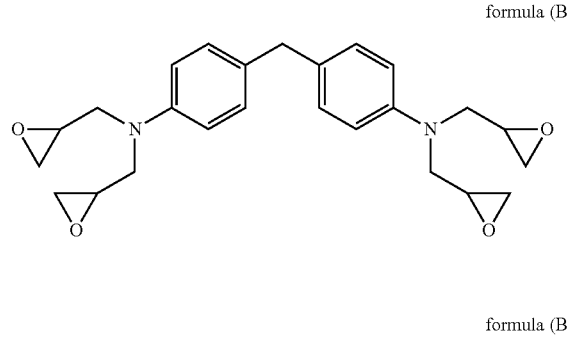
formula (B-13)
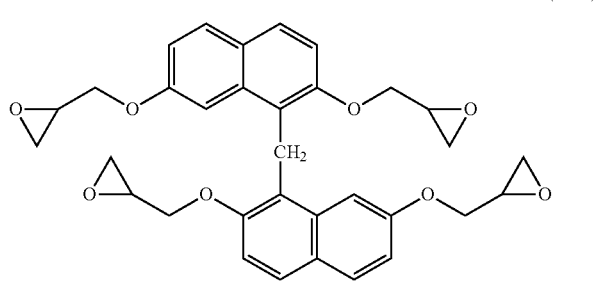
formula (B-14)
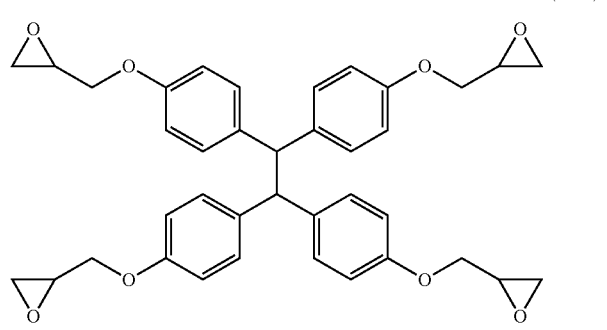
formula (B-15)
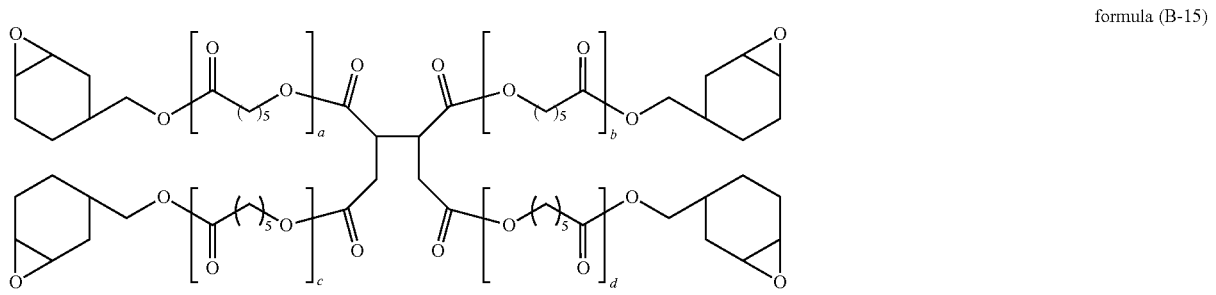

-continued
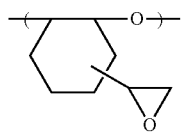 formula (B-16)
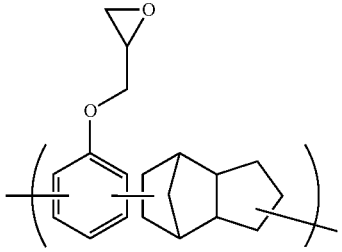 formula (B-17)
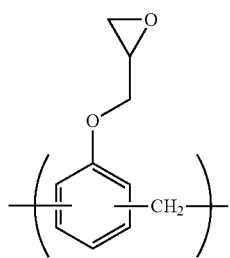 formula (B-18)
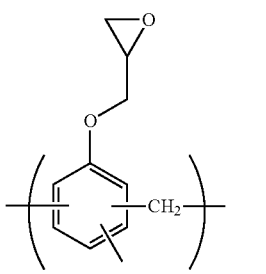 formula (B-19)
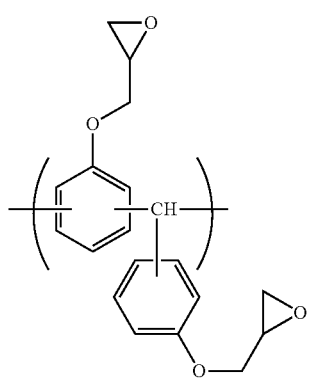 formula (B-20)
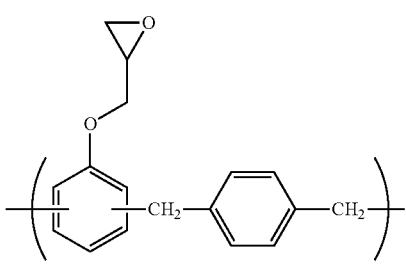 formula (B-21)
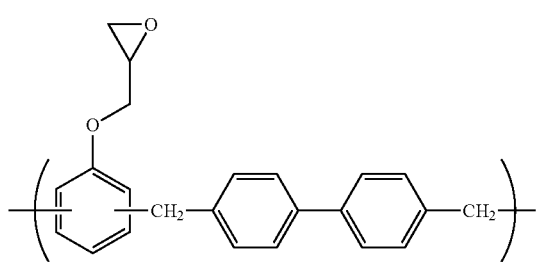 formula (B-22)
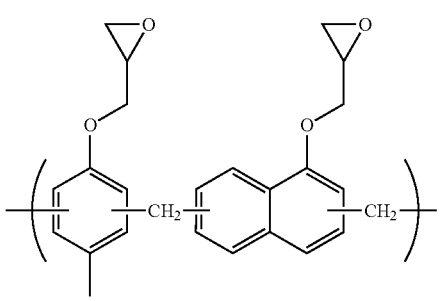 formula (B-23)
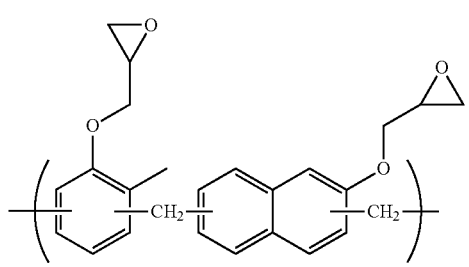 formula (B-24)
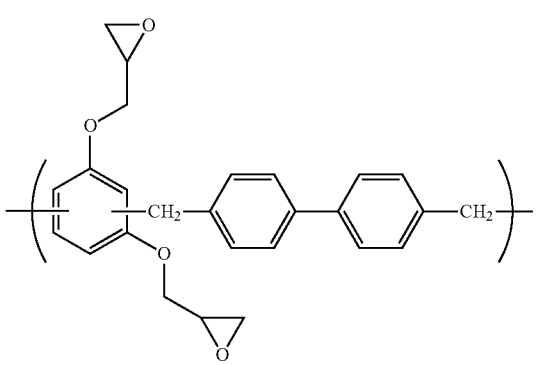 formula (B-25)

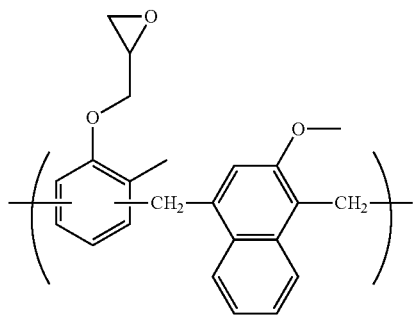

formula (B-26)

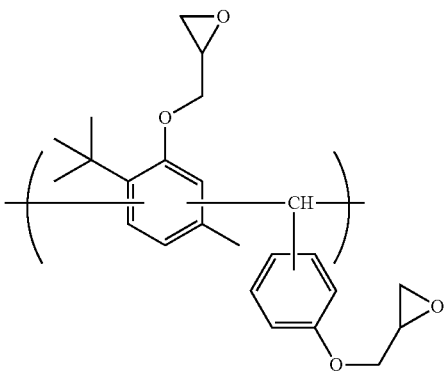

formula (B-27)

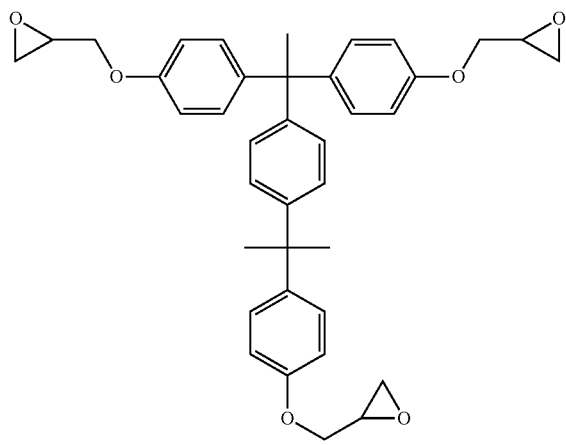

formula (B-28)

Formula (B-1) is available under the trade name TEPIC-SS manufactured by Nissan Chemical Corporation.

Formula (B-2) is available under the trade name MA-DGIC manufactured by SHIKOKU CHEMICALS CORPORATION.

Formula (B-3) is available under the trade name EX-411 manufactured by Nagase ChemteX Corporation.

Formula (B-4) is available under the trade name EX-521 manufactured by Nagase ChemteX Corporation.

Formula (B-7) is available under the trade name RE-810NM manufactured by Nippon Kayaku Co., Ltd.

Formula (B-8) is available under the trade name BATG manufactured by SHOWA DENKO K.K.

Formula (B-9) is available under the trade name EX-711 manufactured by Nagase ChemteX Corporation.

Formula (B-10) is available under the trade name YD-4032D manufactured by DIC CORPORATION.

Formula (B-11) is available under the trade name HP-4770 manufactured by DIC CORPORATION.

Formula (B-12) is available under the trade name YH-434L manufactured by NIPPON STEEL & SUMIKIN CHEMICAL CO., LTD.

Formula (B-13) is available under the trade name EPICLON HP-4700 manufactured by DIC CORPORATION.

Formula (B-14) is available under the trade name TEP-G manufactured by ASAHI YUKIZAI CORPORATION.

Formula (B-15) is available under the trade name EPO-LEAD GT401 manufactured by DAICEL CORPORATION, in which a, b, c and d are each 0 or 1, and a+b+c+d=1.

Formula (B-16) is available under the trade name EHPE-3150 manufactured by DAICEL CORPORATION.

Formula (B-17) is available under the trade name HP-7200L manufactured by DIC CORPORATION.

Formula (B-18) is available under the trade name EPPN-201 manufactured by Nippon Kayaku Co., Ltd.

Formula (B-19) is available under the trade name ECN-1229 manufactured by Asahi Kasei Epoxy Co., Ltd.

Formula (B-20) is available under the trade name EPPN-501H manufactured by Nippon Kayaku Co., Ltd.

Formula (B-21) is available under the trade name NC-2000L manufactured by Nippon Kayaku Co., Ltd.

Formula (B-22) is available under the trade name NC-3000L manufactured by Nippon Kayaku Co., Ltd.

Formula (B-23) is available under the trade name NC-7000L manufactured by Nippon Kayaku Co., Ltd.

Formula (B-24) is available under the trade name NC-7300L manufactured by Nippon Kayaku Co., Ltd.

Formula (B-25) is available under the trade name NC-3500 manufactured by Nippon Kayaku Co., Ltd.

Formula (B-26) is available under the trade name EPICLON HP-5000 manufactured by DIC CORPORATION.

Formula (B-27) is available under the trade name FAE-2500 manufactured by Nippon Kayaku Co., Ltd.

Formula (B-28) is available under the trade name NC-6000 manufactured by Nippon Kayaku Co., Ltd.

Some examples of the proton-generating compound (C) having a partial structure represented by formula (1) are illustrated below. 5-Hydroxy-1,3-benzodioxole (sesamol) and piperonylic acid are preferable.

[Chem. 20]
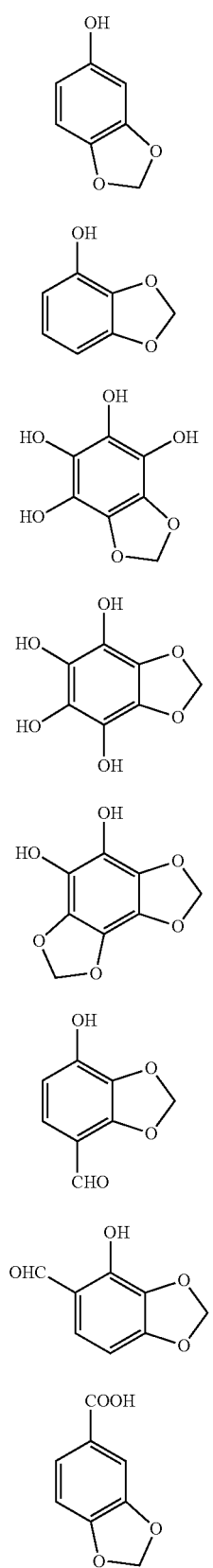
formula (C-1)
formula (C-2)
formula (C-3)
formula (C-4)
formula (C-5)
formula (C-6)
formula (C-7)
formula (C-8)
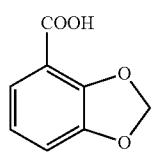
formula (C-9)
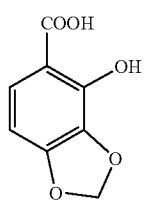
formula (C-10)
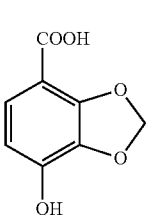
formula (C-11)
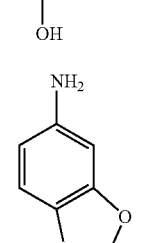
formula (C-12)
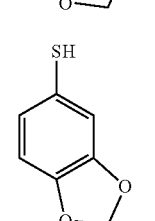
formula (C-13)
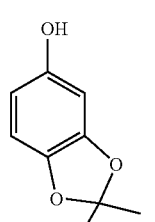
formula (C-14)
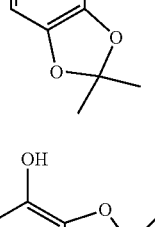
formula (C-15)
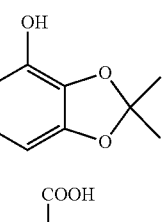
formula (C-16)
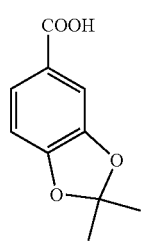

formula (C-17)
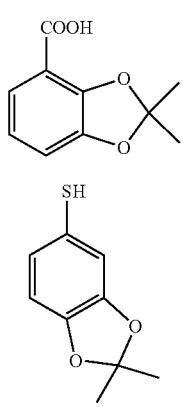
formula (C-18)
formula (C-19)
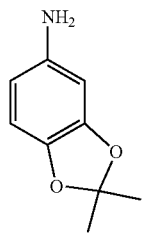
Specific examples of the reaction product (D) having a partial structure represented by formula (1) include, but are not limited to, the following.
formula (D-1)
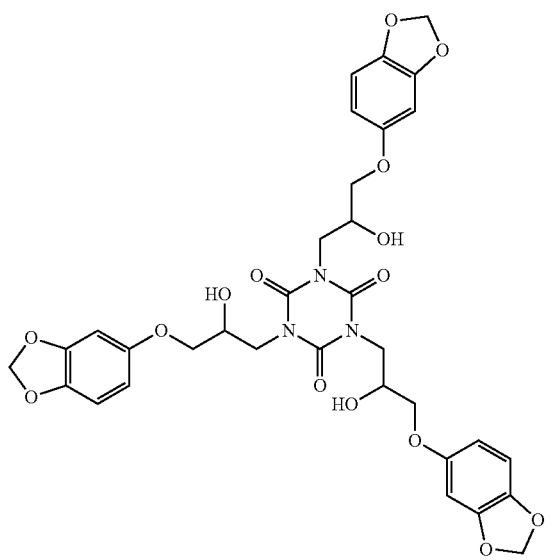
formula (D-2)
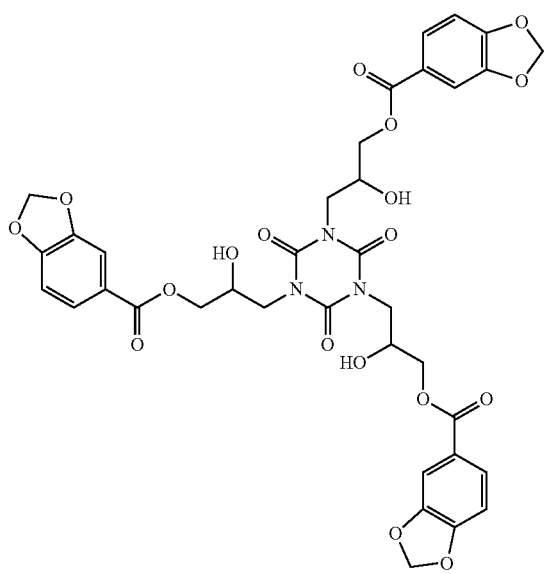
formula (D-3)
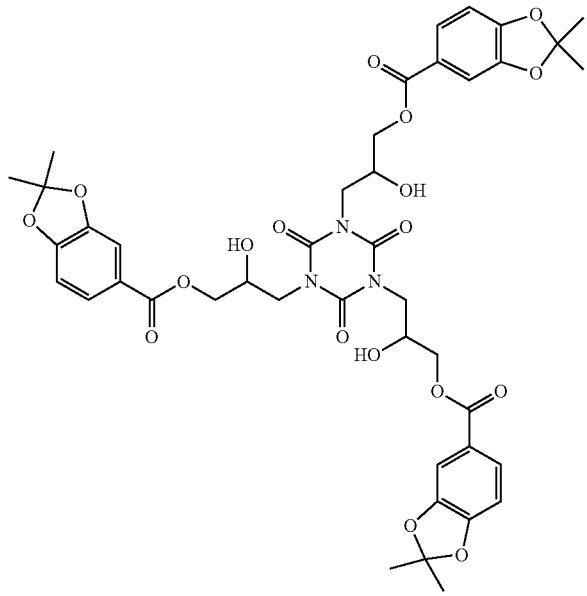

-continued
formula (D-4)
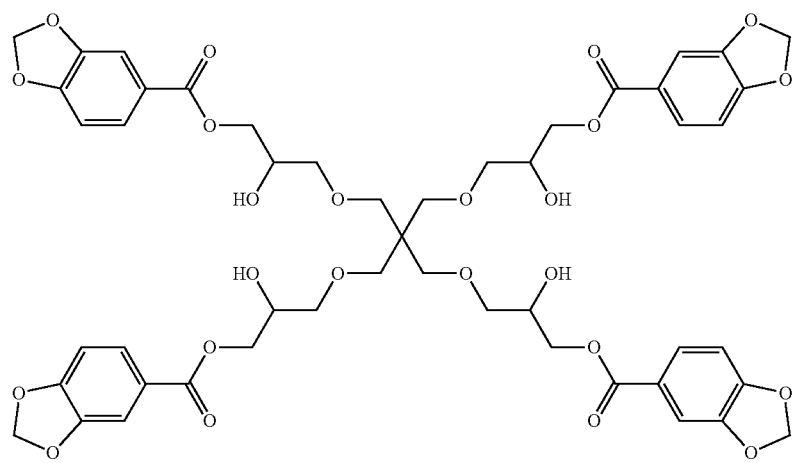
formula (D-5)
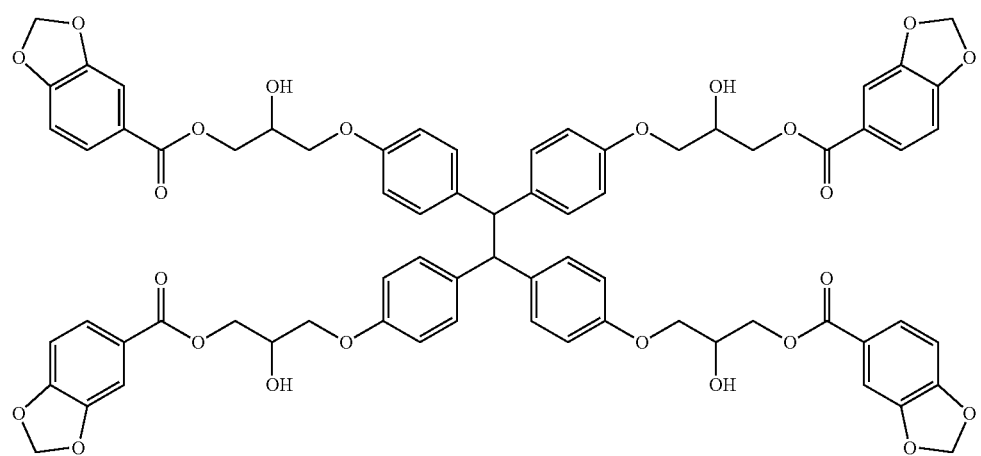
formula (D-6)
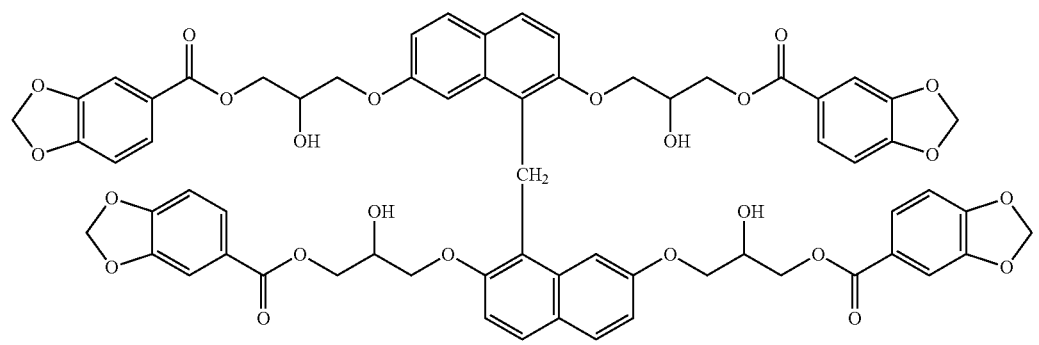

-continued
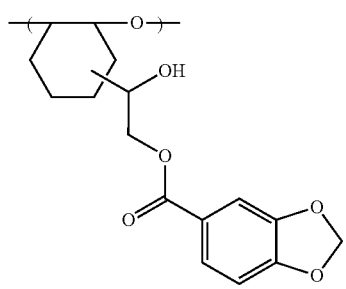
formula (D-7)
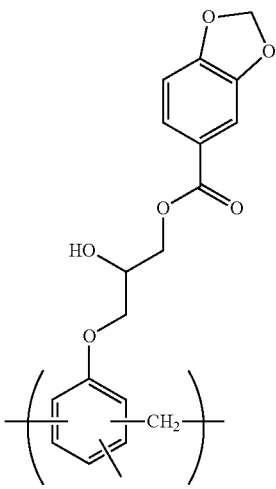
formula (D-8)
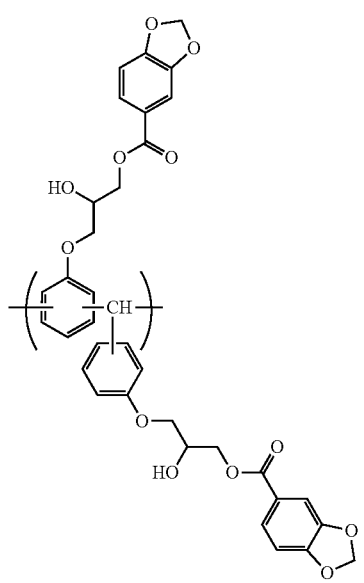
formula (D-9)

Examples of the compound or polymer having a partial structure represented by formula (1) further include novolak resins (E) obtained from a phenolic hydroxy group-containing compound or an aromatic amine, and an aldehyde having a partial structure represented by formula (1), or obtained from a phenolic hydroxy group-containing compound having a partial structure represented by formula (1) and an aldehyde.

The aldehyde having a partial structure represented by formula (1) is preferably heliotropin (piperonal). The phenolic hydroxy group-containing compound having a partial structure represented by formula (1) is preferably 5-hydroxy-1,3-benzodioxole (sesamol).

Specific examples of the reaction product (E) having a partial structure represented by formula (1) include, but are not limited to, the following.

[Chem. 22]

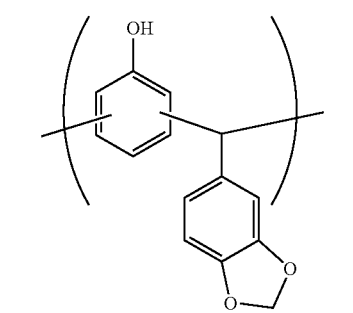

formula (E-1)

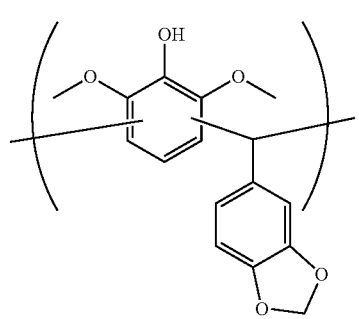

formula (E-2)

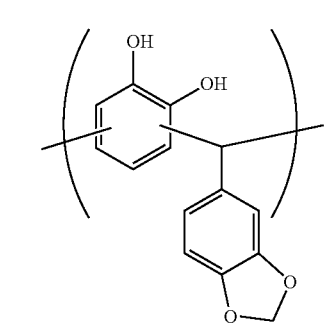

formula (E-3)

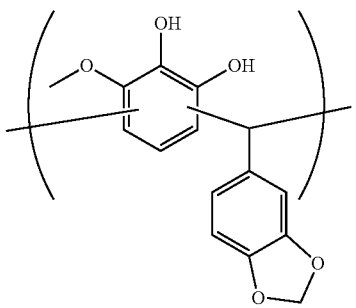

formula (E-4)

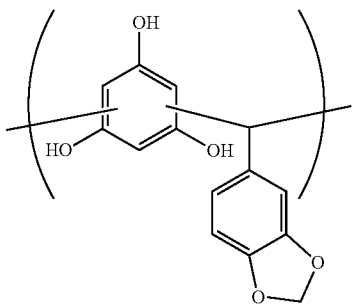

formula (E-5)

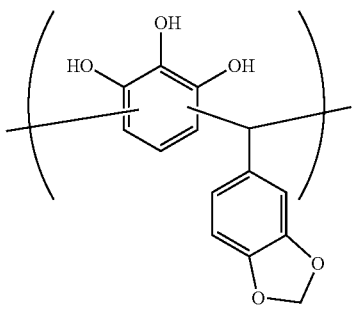

formula (E-6)

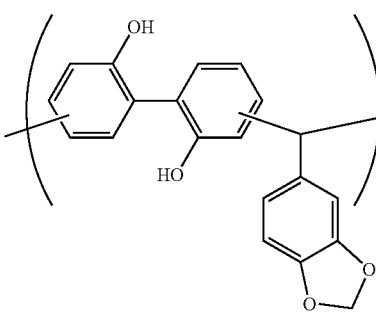

formula (E-7)

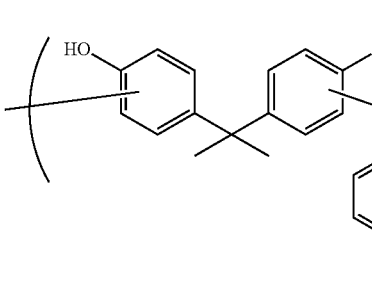

formula (E-8)

formula (E-9)
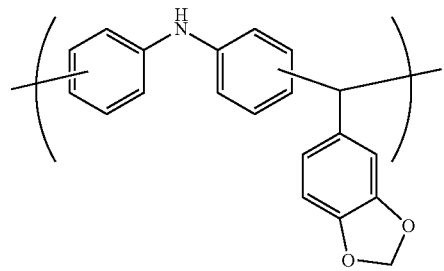
formula (E-10)
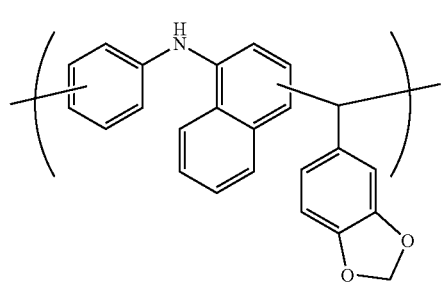
formula (E-11)
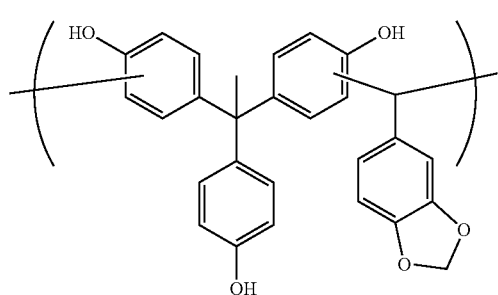
formula (E-12)
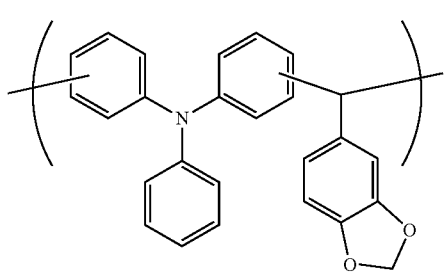
[Chem. 23]
formula (E-13)
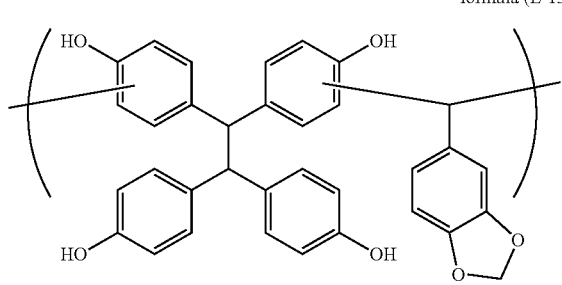
formula (E-14)
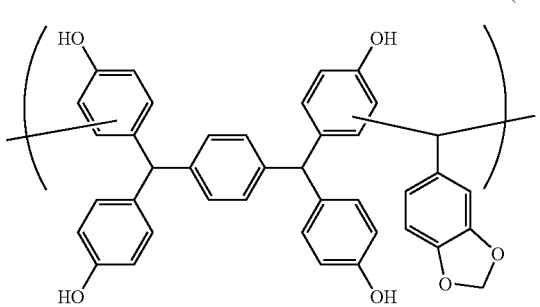
formula (E-15)
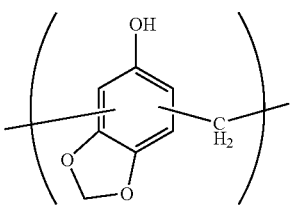
formula (E-16)
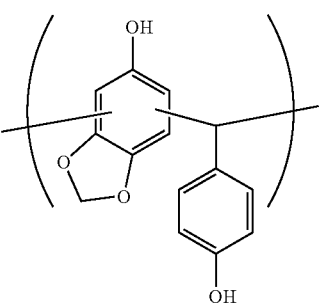
formula (E-17)
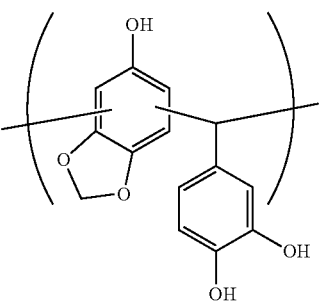
formula (E-18)
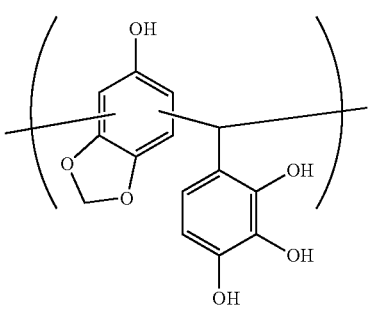

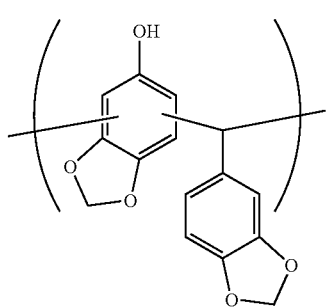

formula (E-19)

Compound (b) Containing at Least One Amide Structure in the Molecule

The compound containing at least one amide structure in the molecule preferably includes a partial structure represented by —CO—NH— or —CO—N=.

The compound (b) is preferably represented by formula (2):

[Chem. 24]

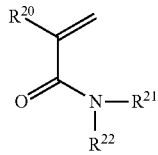

formula (2)

(In formula (2), $R^{20}$ denotes a hydrogen atom or a methyl group, and $R^{21}$ and $R^{22}$ are the same as or different from each other and are each a hydrogen atom, or a C1-C10 alkyl or C6-C40 aryl group optionally substituted with a monovalent organic group (B) and optionally interrupted by an oxygen atom or a quaternary ammonium cation.)

The quaternary ammonium cation is preferably substituted with a C1-C5 alkyl group.

Specific examples of the C1-C10 alkyl group include those C1-C10 alkyl groups mentioned hereinabove.

Specific examples of the C1-C5 alkyl group include those having 1 to 5 carbon atoms out of the C1-C10 alkyl groups mentioned hereinabove.

Specific examples of the C6-C40 aryl group include those C6-C40 aryl groups mentioned hereinabove.

The monovalent organic group (B) is preferably selected from a hydroxy group, a cyano group, a sulfo group, a carboxylate group, a boron atom optionally substituted with one or two hydroxy groups, an optionally halogenated C1-C6 alkyl group, and an —NR$^{a1}$R$^{b1}$ group (R$^{a1}$ and R$^{b1}$ are the same as or different from each other and each denote a hydrogen atom or a C1-C3 alkyl group).

Specific examples of the C1-C6 alkyl group include those having 1 to 6 carbon atoms out of the C1-C10 alkyl groups mentioned hereinabove.

Specific examples of the C1-C3 alkyl group include those having 1 to 3 carbon atoms out of the C1-C10 alkyl groups mentioned hereinabove.

Specific examples of the compound represented by formula (2) include, but are not limited to, those compounds represented by the following structural formulae.

[Chem. 25]

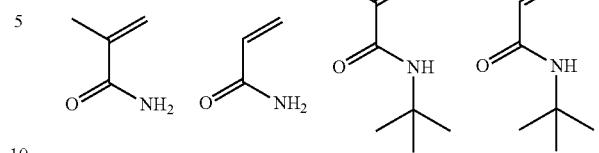

[Chem. 26]

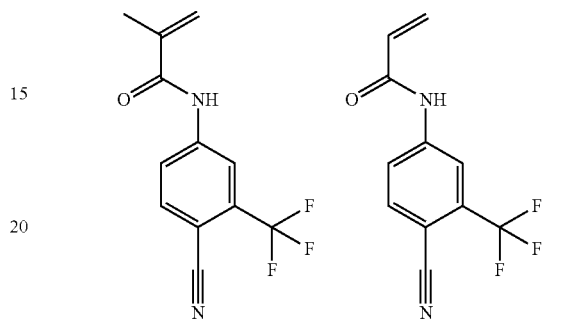

[Chem. 27]

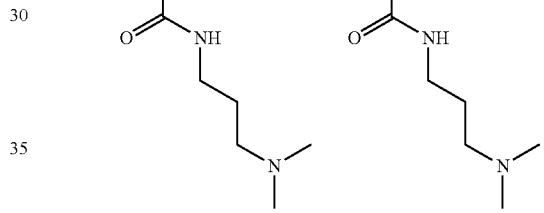

[Chem. 28]

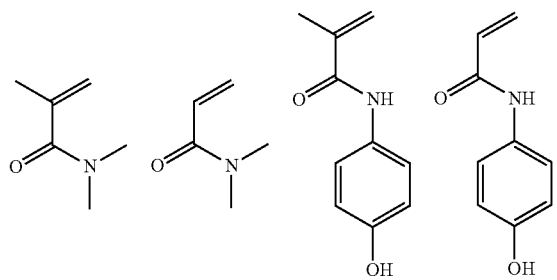

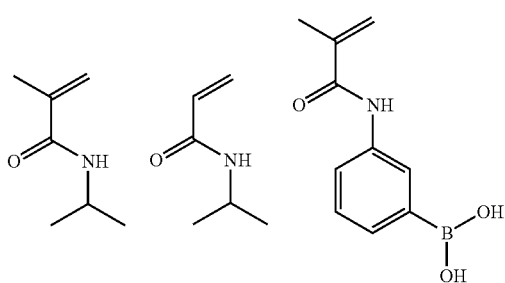

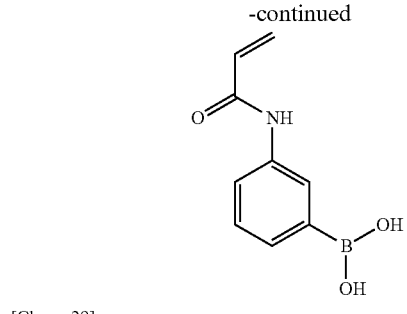
[Chem. 29]
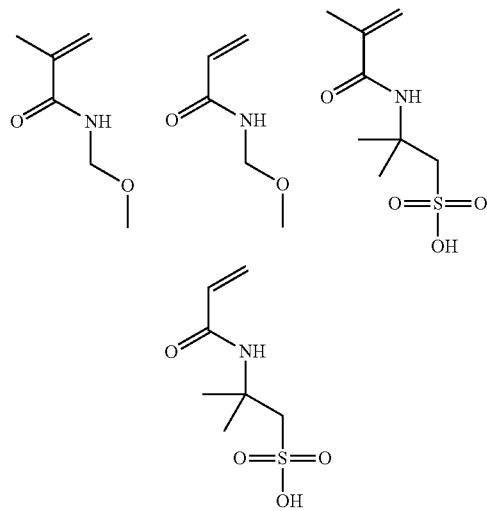
[Chem. 30]
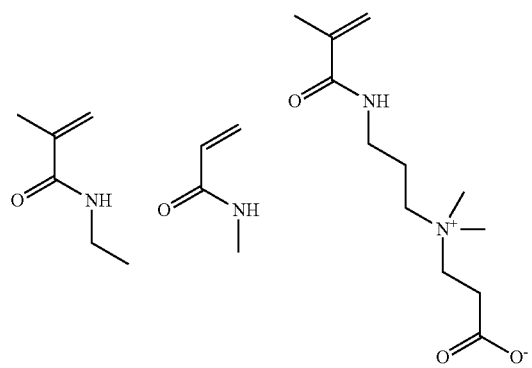
[Chem. 31]
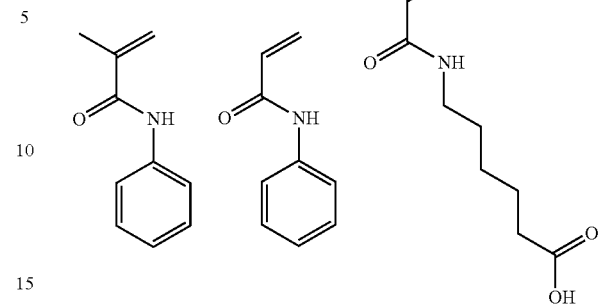
[Chem. 32]
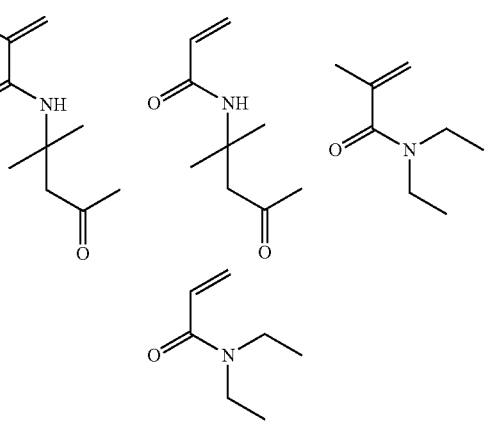

-continued
[Chem. 33]
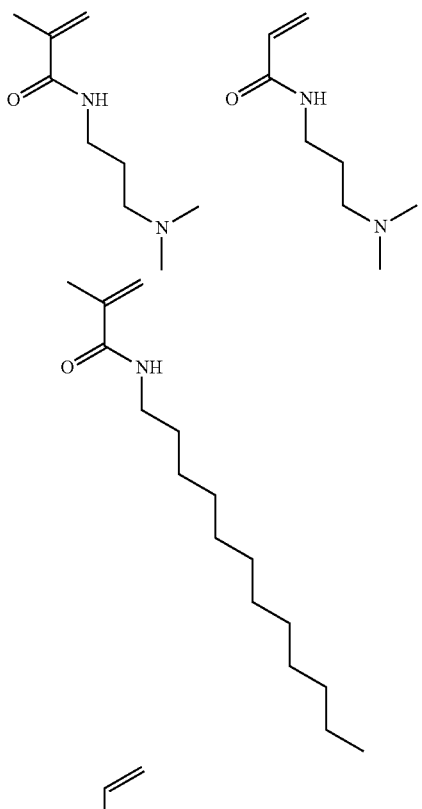
[Chem. 34]
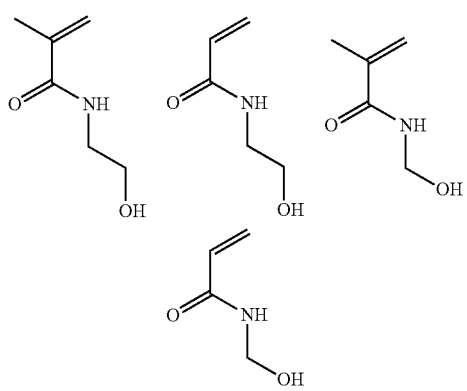
Examples of the partial structure of the copolymer derived from the compound represented by formula (2) include those structural units represented by the following formulae:
[Chem. 35]
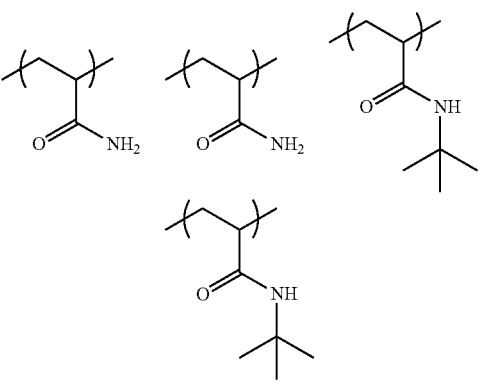
[Chem. 36]
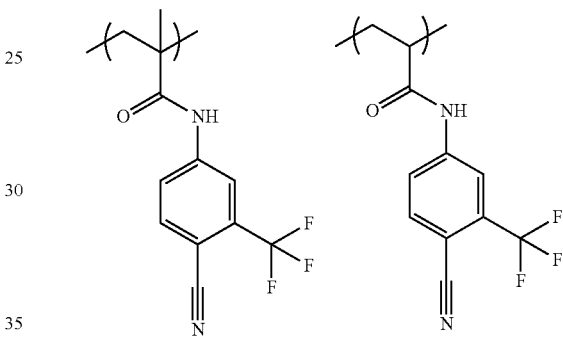
[Chem. 37]
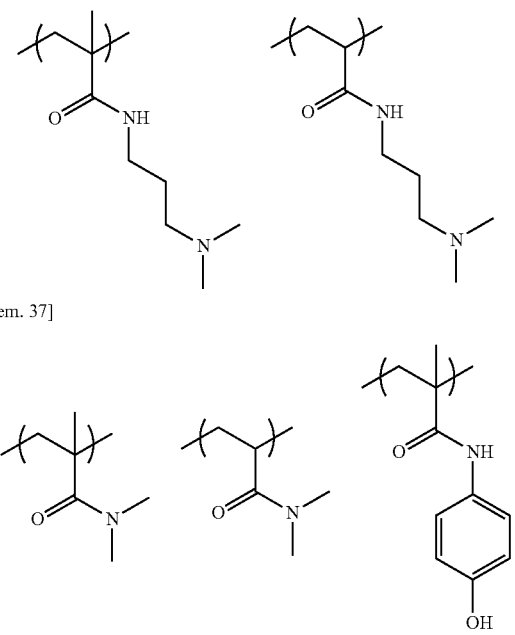

-continued
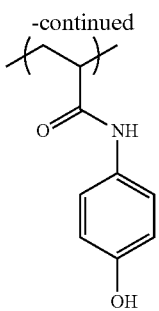
[Chem. 38]
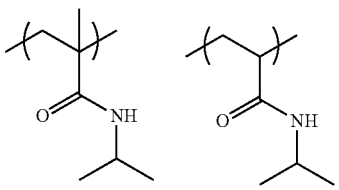
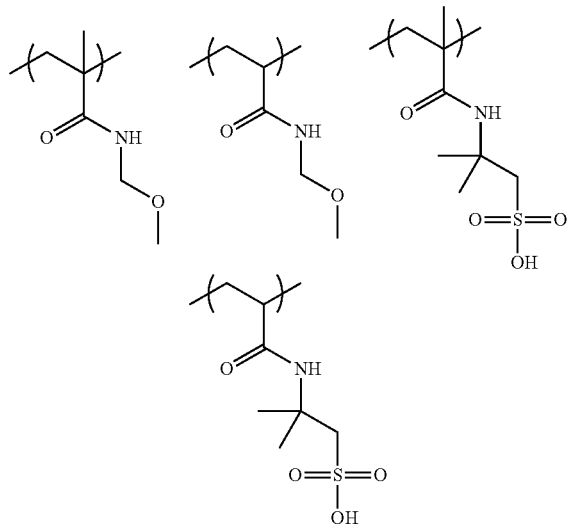
[Chem. 39]
[Chem. 40]
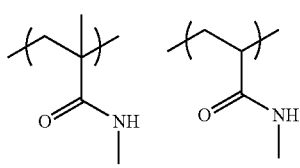
-continued
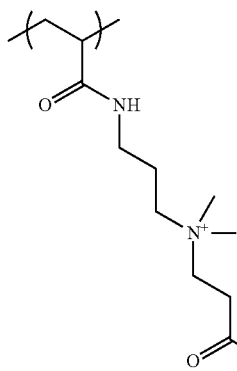
[Chem. 41]
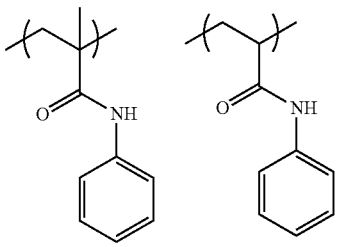
[Chem. 42]
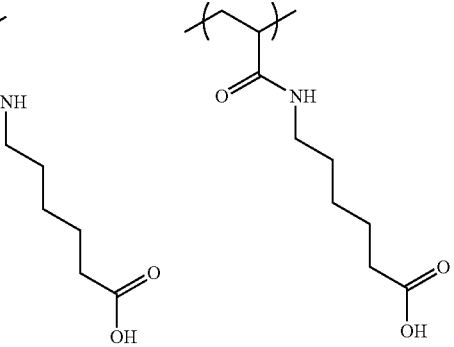
[Chem. 43]
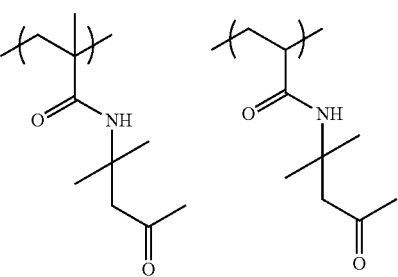

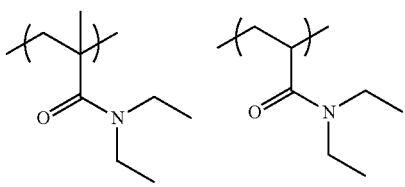

[Chem. 44]

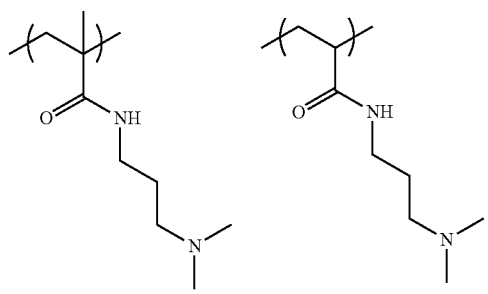

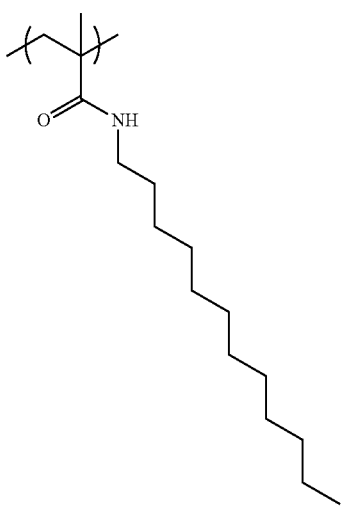

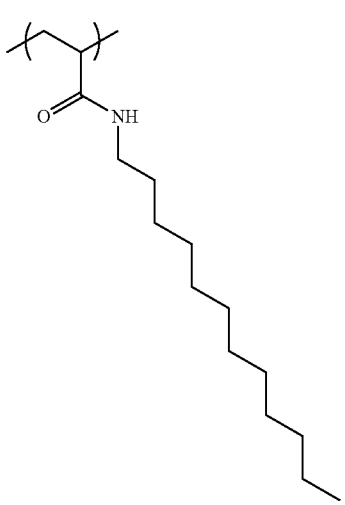

[Chem. 45]

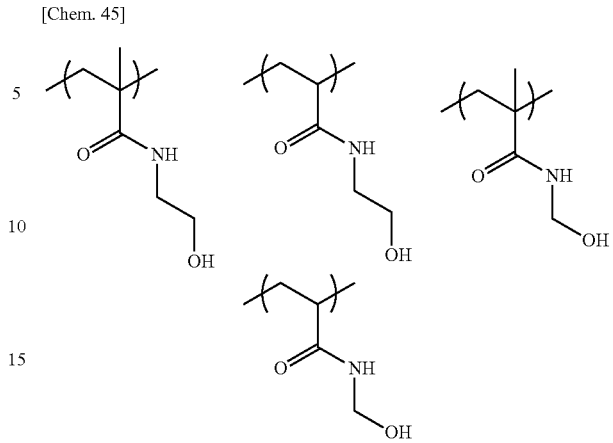

The compound (b) may be represented by formula (2-1):

[Chem. 46]

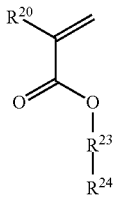

formula (2-1)

(In formula (2-1), $R^{20}$ denotes a hydrogen atom or a methyl group, $R^{23}$ denotes a C1-C5 alkylene group, and $R^{24}$ denotes a blocked isocyanate group.)

The blocked isocyanate group may be represented by the following general formula (21):

[Chem. 47]

(21)

[In the above formula, A denotes a residue of an isocyanate blocking compound selected from the group consisting of alcohols, amines, amides, active methylene compounds, nitrogen-containing heteroaryl compounds, oximes, ketoximes and hydroxamic acid esters.]

$R^{25}$ denotes a blocked isocyanate group. The blocked isocyanate group is an isocyanate group that is blocked by a thermally removable protective group, more specifically, a group resulting from reaction of an isocyanate group with an isocyanate blocking compound (a blocking agent).

In general, the isocyanate blocking agent refers to an agent which reacts with an isocyanate group to prevent the isocyanate group from reacting with a functional group (such as, for example, an acid functional group) in another molecule at room temperature and which is removed at an increased temperature to regenerate the isocyanate group, thus allowing the isocyanate group to react (for example, with an acid functional group) afterwards.

Examples of the blocking agent include alcohols such as methanol, ethanol, isopropanol, n-butanol, 2-ethoxyhexanal, 2-N,N-dimethylaminoethanol, 2-ethoxyethanol and cyclohexanol; phenols such as phenol, o-nitrophenol, p-chlorophenol, o-cresol, m-cresol and p-cresol; lactams such as ε-caprolactam; oximes such as acetone oxime, methyl ethyl ketone oxime, methyl isobutyl ketone oxime, cyclohexanone oxime, acetophenone oxime and benzophenone oxime; amines; amides; nitrogen-containing heteroaryl compounds such as pyrazole, 3,5-dimethylpyrazole and 3-methylpyrazole; thiols such as dodecanethiol and benzenethiol; active methylene compounds such as malonic acid diesters, acetoacetic acid esters, malonic acid dinitrile, acetylacetone, methylenedisulfone, dibenzoylmethane, dipivaloylmethane and acetonedicarboxylic acid diesters; and hydroxamic acid esters.

The volatile blocking agent that evaporates from the composition after its removal are advantageous.

For example, the blocked isocyanate group is represented by:

[Chem. 48]

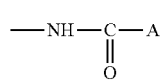
(21)

[In the formula, A denotes a residue of an isocyanate blocking compound selected from the group consisting of alcohols, amines, amides, active methylene compounds, nitrogen-containing heteroaryl compounds, oximes, ketoximes and hydroxamic acid esters.]

Specific examples of the isocyanate compound represented by formula (20) include isocyanate-containing (meth)acrylates such as 2-isocyanatoethyl methacrylate and 2-isocyanatoethyl acrylate, optionally protected with blocking agents such as methyl ethyl ketone oxime, ε-caprolactam, γ-caprolactam, 3,5-dimethylpyrazole, diethyl malonate, ethanol, isopropanol, n-butanol and 1-methoxy-2-propanol. These compounds may be used each alone or in combination of two or more.

The isocyanate compounds (B) may be synthesized by known methods or may be purchased as the following commercially available products.

Karenz AOI (registered trademark, 2-isocyanatoethyl acrylate manufactured by SHOWA DENKO K.K.)

Karenz AOI-BM (registered trademark, 2-(O-[1'-methylpropylideneamino]carboxyamino)ethyl acrylate manufactured by SHOWA DENKO K.K.)

Karenz AOI-VM (registered trademark, 2-isocyanatoethyl acrylate manufactured by SHOWA DENKO K.K.)

Karenz MOI (registered trademark, 2-isocyanatoethyl methacrylate manufactured by SHOWA DENKO K.K.)

Karenz MOI-BM (registered trademark, 2-(O-[1'-methylpropylideneamino]carboxyamino)ethyl methacrylate manufactured by SHOWA DENKO K.K.)

Karenz MOI-BP (registered trademark, 2-[(3,5-dimethylpyrazolyl)carbonylamino]ethyl methacrylate manufactured by SHOWA DENKO K.K.)

Karenz MOI-EG (registered trademark, manufactured by SHOWA DENKO K.K.)

Karenz BEI (registered trademark, 1,1-(bisacryloyloxymethyl)ethyl isocyanate manufactured by SHOWA DENKO K.K.)

Of those mentioned above, 2-(O-[1'-methylpropylideneamino]carboxyamino)ethyl methacrylate (for example, Karenz MOI-BM (manufactured by SHOWA DENKO K.K.)) is preferable.

Examples of the compounds represented by formula (2-1) include, but are not limited to, those compounds represented by the following structural formulae:

[Chem. 49]

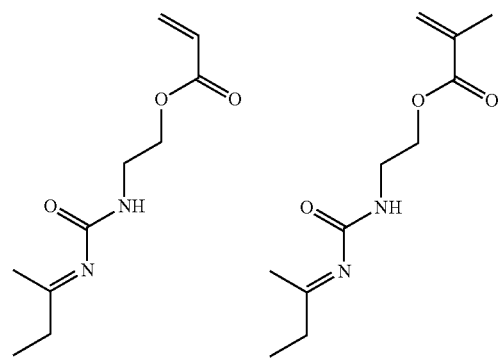

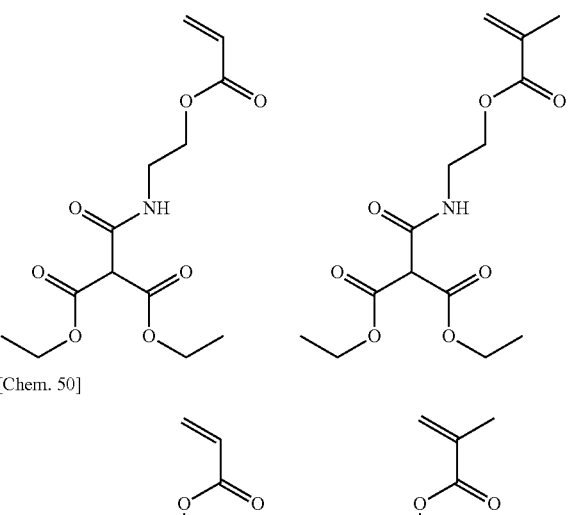

[Chem. 50]

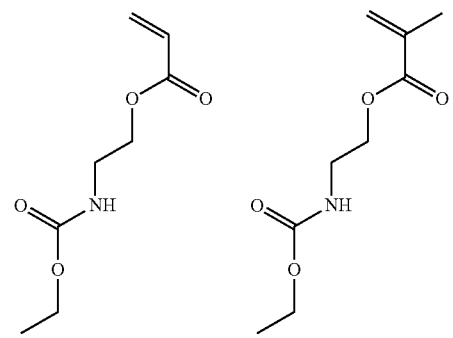

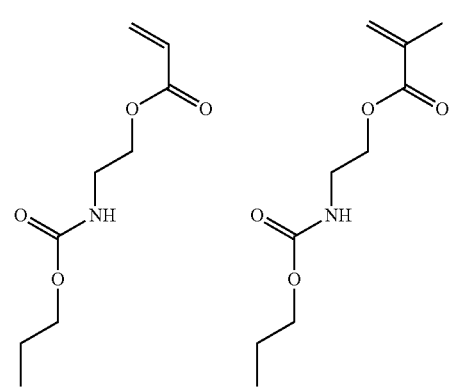

[Chem. 51]
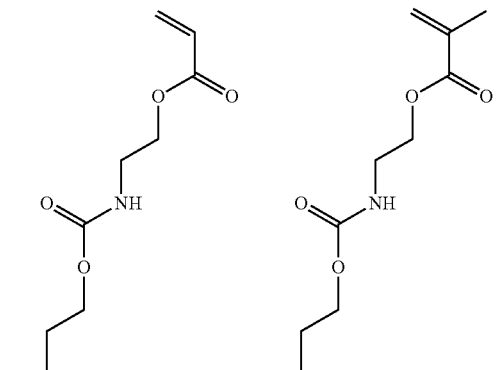
[Chem. 52]
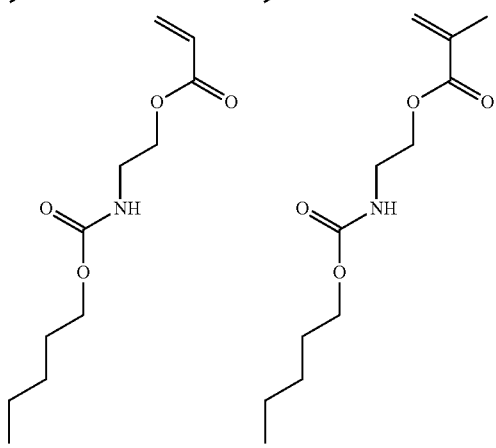
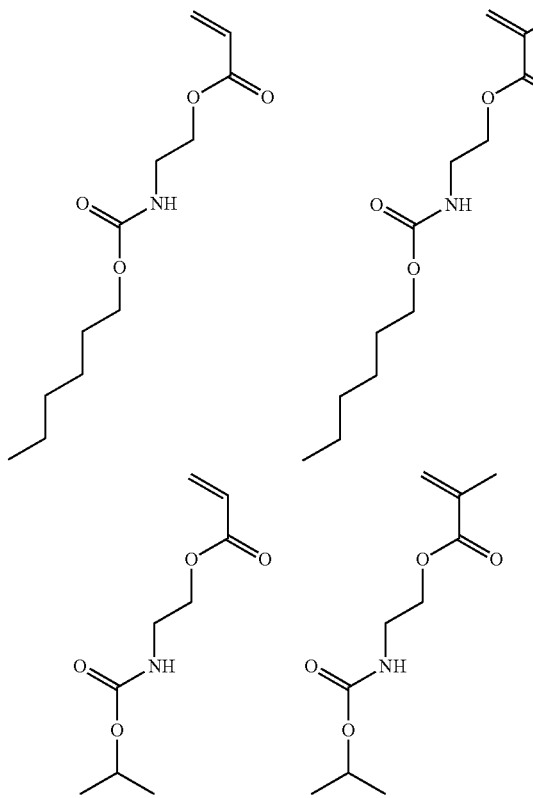
[Chem. 53]
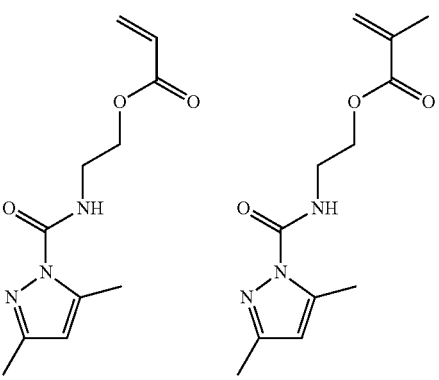
Examples of the partial structure of the copolymer derived from the compounds represented by formula (2-1) include those structural units represented by the following formulae:
[Chem. 54]
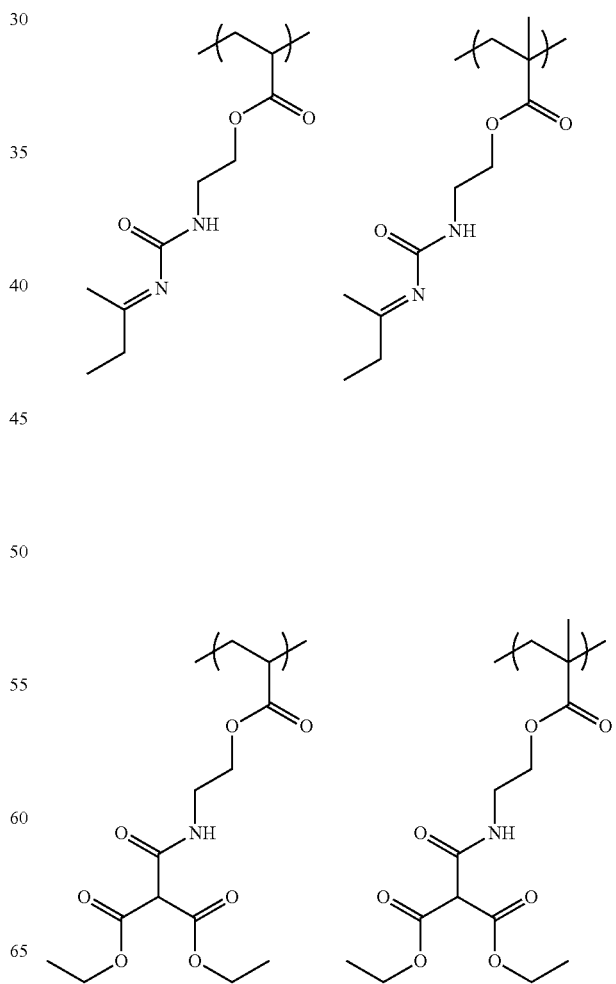

[Chem. 55]

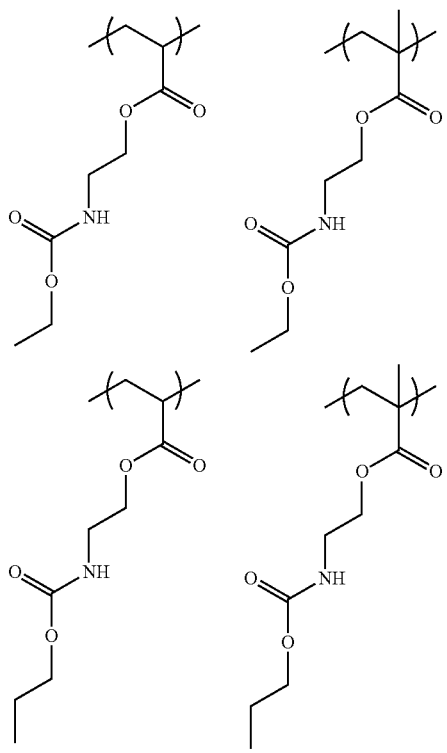

[Chem. 56]

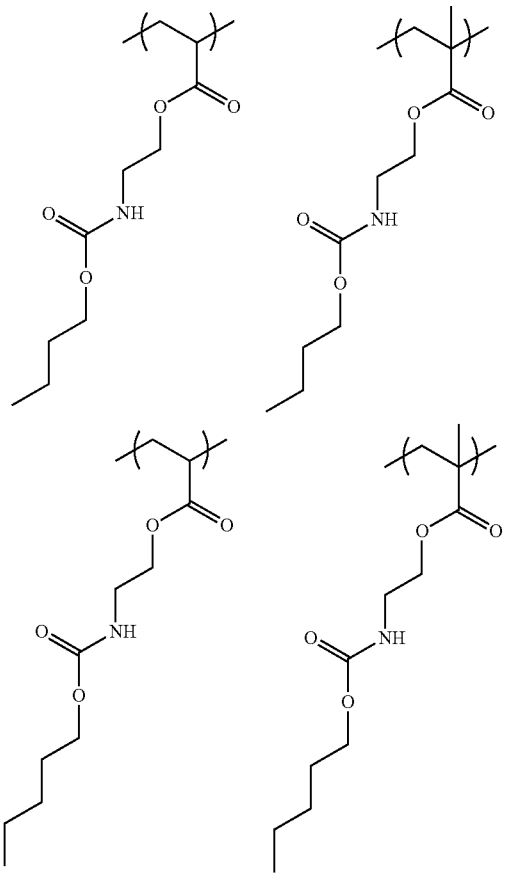

[Chem. 57]

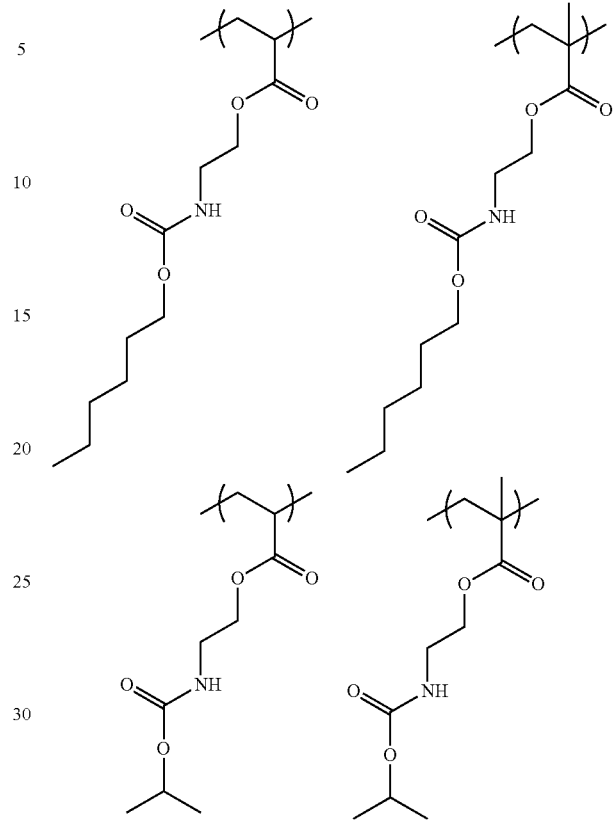

[Chem. 58]

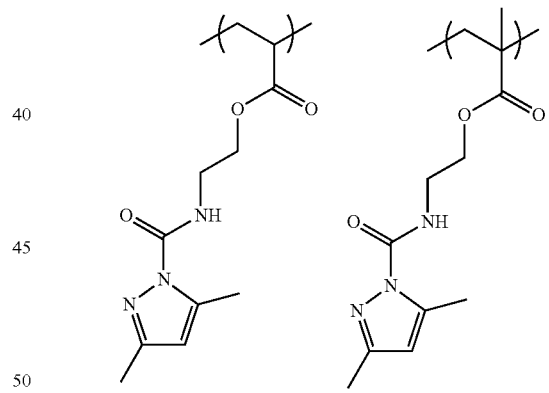

The molar ratio of compound (b) containing at least one amide structure in the molecule relative to the whole copolymer is within the range of 5 to 80% by mole, preferably 8 to 50% by mole, and preferably 10 to 30% by mole. The unit structure having a partial structure represented by formula (1) may be one type, or more than one type.

When the polymer is a copolymer that includes a unit structure having a partial structure different from the partial structures represented by formula (1) and formula (2), the molar ratio of such a third component in the copolymer is the balance after the deduction of the unit structures having a partial structure represented by formula (1) and formula (2). The third component is preferably a unit structure having a site reactive with a crosslinking agent for crosslinking the molecules of the copolymer. Examples of such reactive sites include a hydroxy group. The proportion of the unit structures having a site reactive with a crosslinking agent is within the range of 5 to 30% by mole, preferably 8 to 25% by mole, and preferably 10 to 23% by mole relative to the whole copolymer. The third component may be a single species, or a combination of two or more species.

In a preferred embodiment, the copolymer includes, based on the whole copolymer, 15 to 85% by mole of unit structure represented by formula (1), 5 to 30% by mole of unit structure represented by formula (2), and 10 to 30% by mole of unit structure having a site reactive with a crosslinking agent for crosslinking the molecules of the copolymer. The copolymer of the present invention may be obtained by copolymerizing, by a method known per se, a compound (a) containing at least one acetal structure in the molecule, a compound (b) containing at least one amide structure in the molecule, and optionally a compound capable of giving a partial structure different from the partial structures represented by formula (1) and formula (2).

The third component is preferably a unit structure represented by any of the following formulae (A-7) to (A-18):

[Chem. 59]

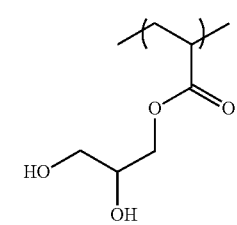

formula (A-7)

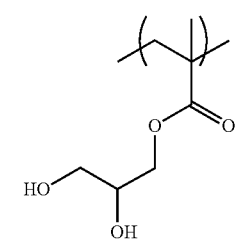

formula (A-8)

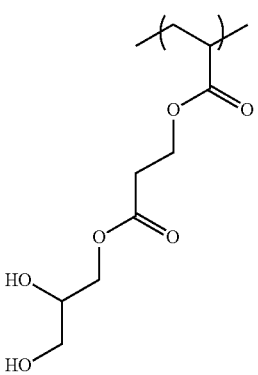

formula (A-9)

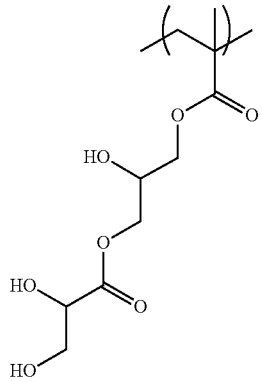

formula (A-10)

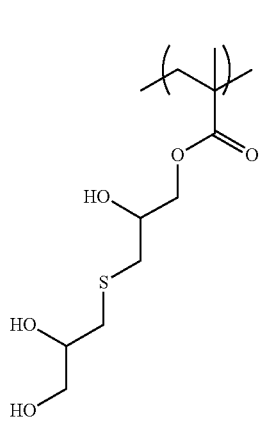

formula (A-11)

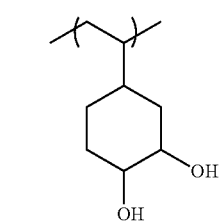

formula (A-12)

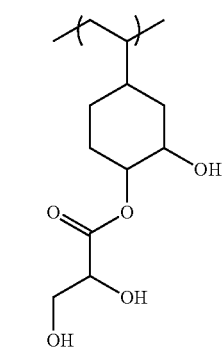

formula (A-13)

formula (A-14)

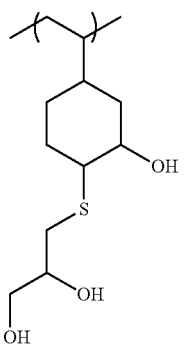

formula (A-15)

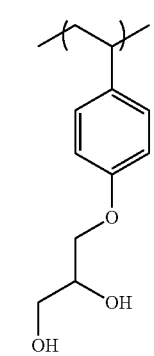

formula (A-16)

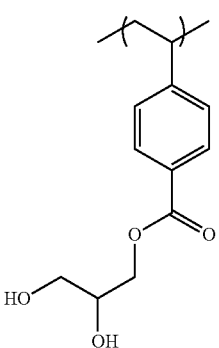

formula (A-17)

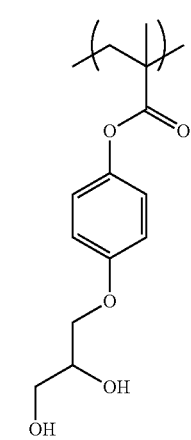

formula (A-18)

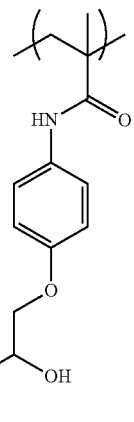

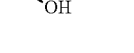

The polymer (copolymer) described above may be one having a weight average molecular weight of, for example, 1,000 to 100,000, or 1,500 to 50,000, or 2,000 to 30,000, or 3,000 to 20,000.

Crosslinking Catalysts

The protective film-forming composition of the present invention may include a crosslinking catalyst for accelerating the crosslinking reaction as an optional component. The crosslinking catalyst may be an acidic compound (a crosslinking acid catalyst) as well as a compound that generates an acid or a base when heated. The acidic compound may be a sulfonic acid compound or a carboxylic acid compound, and the compound that generates an acid when heated may be a thermal acid generator. In particular, it is preferable to use a crosslinking acid catalyst.

Examples of the sulfonic acid compound and the carboxylic acid compound include ammonium trifluoroacetic acid, p-toluenesulfonic acid, trifluoromethanesulfonic acid, pyridinium trifluoromethanesulfonate, pyridinium-p-toluenesulfonate, pyridinium-4-hydroxybenzenesulfonate, salicylic acid, camphorsulfonic acid, 5-sulfosalicylic acid, 4-chlorobenzenesulfonic acid, 4-hydroxybenzenesulfonic acid, pyridinium-4-hydroxybenzenesulfonic acid, benzenedisulfonic acid, 1-naphthalenesulfonic acid, 4-nitrobenzenesulfonic acid, citric acid, benzoic acid and hydroxybenzoic acid.

Examples of the thermal acid generator include K-PURE [registered trademark] series CXC-1612, CXC-1614, TAG-2172, TAG-2179, TAG-2678 and TAG-2689 (all manufactured by King Industries), and SI-45, SI-60, SI-80, SI-100, SI-110 and SI-150 (all manufactured by SANSHIN CHEMICAL INDUSTRY CO., LTD.).

The crosslinking catalyst may be used each alone or in combination of two or more.

When the protective film-forming composition includes a crosslinking catalyst, the content thereof is within the range of 0.0001 to 20% by weight, preferably 0.01 to 15% by weight, and more preferably 0.1 to 10% by mass of the total solid content in the protective film-forming composition.

Crosslinking Agent

The resist underlayer film-forming composition of the present invention may include a crosslinking agent component. Examples of the crosslinking agent include melamine compounds, substituted urea compounds, and polymers thereof. The crosslinking agent having at least two crosslinking substituents is preferable. Examples thereof include methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea and methoxymethylated thiourea. Further, a condensate of these compounds may also be used.

A crosslinking agent having a high heat resistance may be used as the crosslinking agent. The crosslinking agent having a high heat resistance may be a compound containing a crosslinking substituent having an aromatic ring (for example, a benzene ring or a naphthalene ring) in the molecule.

Examples of such compounds include a compound having a partial structure of the following formula (5-1), and a polymer or oligomer having a repeating unit of the following formula (5-2).

[Chem. 60]

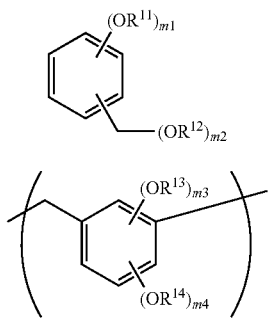

formula (5-1)

formula (5-2)

In the above formulae, $R^{11}$, $R^{12}$, $R^{13}$ and $R^{14}$ are the same as or different from one another and are each a hydrogen atom or a C1-C10 alkyl group. Examples of the alkyl group include the alkyl groups described hereinabove.

m1 meets $1 \leq m1 \leq 6-m2$, m2 meets $1 \leq m2 \leq 5$, m3 meets $1 \leq m3 \leq 4-m2$, and m4 meets $1 \leq m4 \leq 3$.

Examples of the compound, polymers and oligomers of formulae (5-1) and (5-2) include the following:

[Chem. 61]

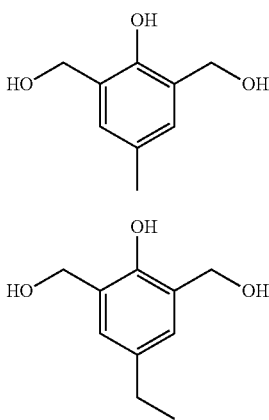

formula (6-1)

formula (6-2)

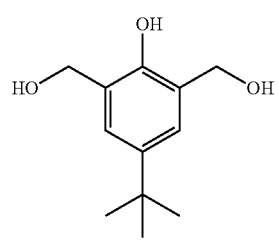

formula (6-3)

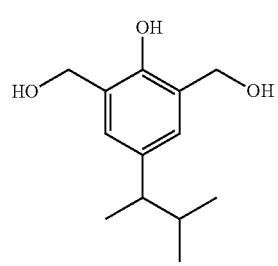

formula (6-4)

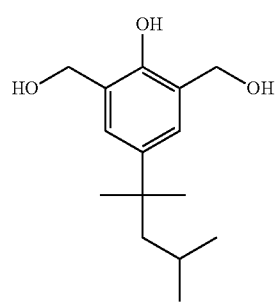

formula (6-5)

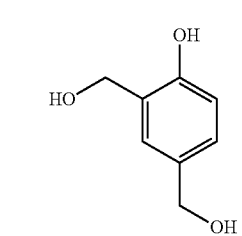

formula (6-6)

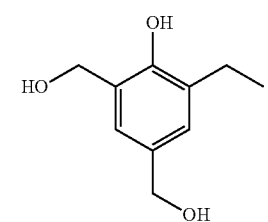

formula (6-6)

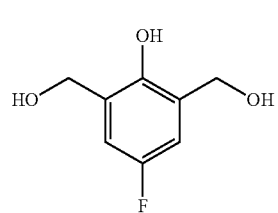

formula (6-7)

formula (6-8)
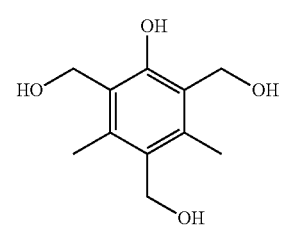
formula (6-9)
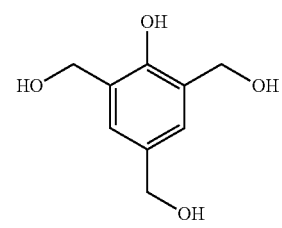
formula (6-10)
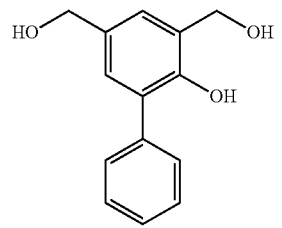
formula (6-11)
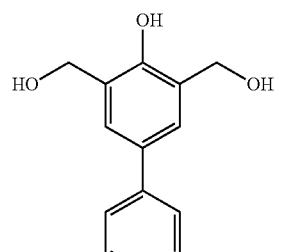
formula (6-12)
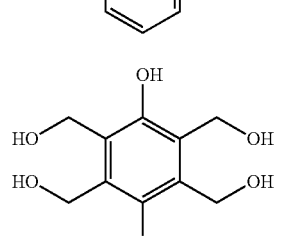
formula (6-13)
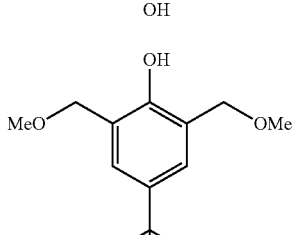
formula (6-14)
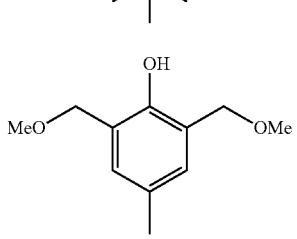
[Chem. 62]
formula (6-15)
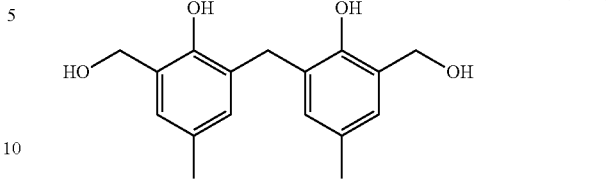
formula (6-16)
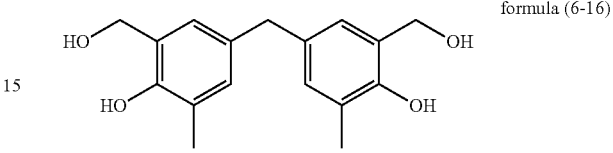
formula (6-17)
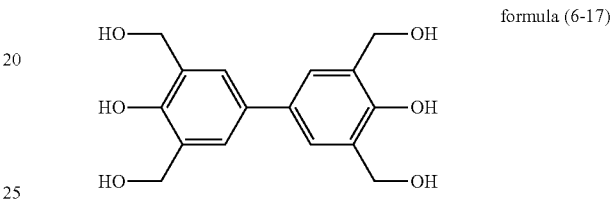
formula (6-18)
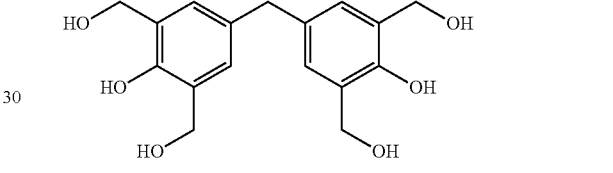
formula (6-19)
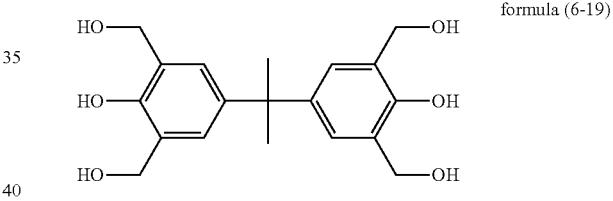
formula (6-20)
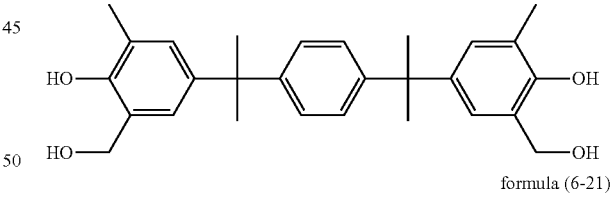
formula (6-21)
formula (6-22)
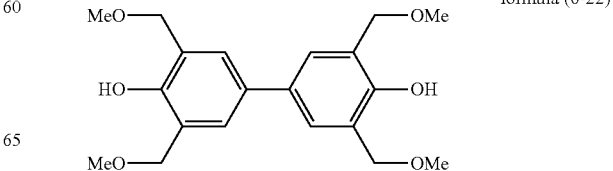

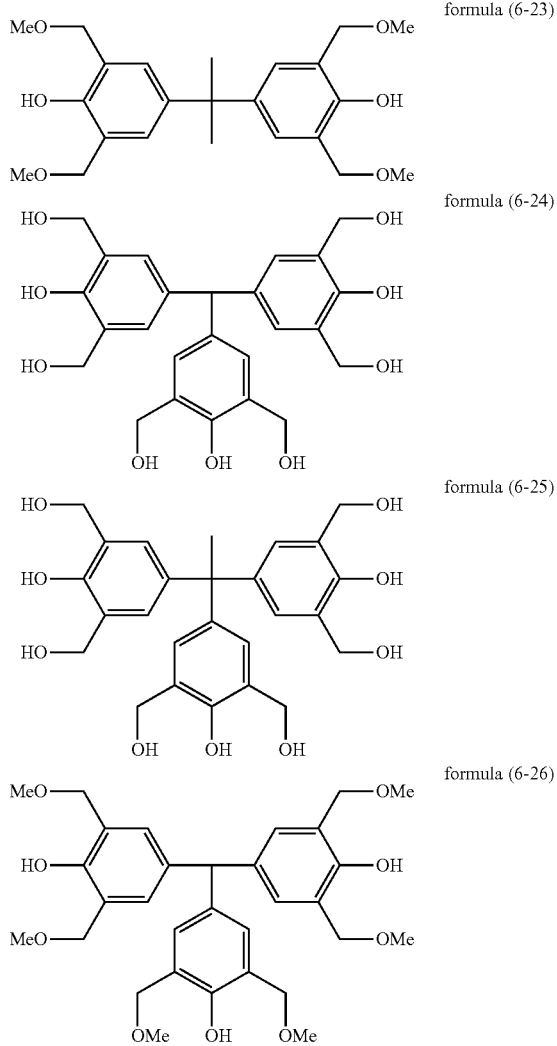

formula (6-23)
formula (6-24)
formula (6-25)
formula (6-26)

The compounds mentioned above may be obtained as products of ASAHI YUKIZAI CORPORATION and Honshu Chemical Industry Co., Ltd. Of the crosslinking agents illustrated above, for example, the compound of formula (6-22) is available under the trade name TMOM-BP from ASAHI YUKIZAI CORPORATION.

The crosslinking agent may be used each alone or in combination of two or more.

The amount in which the crosslinking agent is added varies depending on factors such as the coating solvent that is used, the base substrate that is used, the required solution viscosity and the required film shape, but is usually within the range of 0.001 to 80% by weight, preferably 0.01 to 50% by weight, and more preferably 0.1 to 40% by weight of the total solid content in the protective film-forming composition. Although the crosslinking agents mentioned above may cause a crosslinking reaction by self-condensation, they may cause a crosslinking reaction with a crosslinking substituent in the polymer of the present invention described above when it is present.

Surfactant

The protective film-forming composition of the present invention may include a surfactant as an optional component for enhancing the applicability to a semiconductor substrate. Examples of the surfactant include nonionic surfactants such as polyoxyethylene alkyl ethers including polyoxyethylene lauryl ether, polyoxyethylene stearyl ether, polyoxyethylene cetyl ether and polyoxyethylene oleyl ether, polyoxyethylene alkylaryl ethers including polyoxyethylene octylphenyl ether and polyoxyethylene nonylphenyl ether, polyoxyethylene/polyoxypropylene block copolymers, sorbitan fatty acid esters including sorbitan monolaurate, sorbitan monopalmitate, sorbitan monostearate, sorbitan monooleate, sorbitan trioleate and sorbitan tristearate, and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate, fluorosurfactants such as EFTOP [registered trademark] series EF301, EF303 and EF352 (manufactured by Mitsubishi Materials Electronic Chemicals Co., Ltd.), MEGAFACE [registered trademark] series F171, F173, R-30, R-30N, R-40 and R-40-LM (manufactured by DIC CORPORATION), Fluorad series FC430 and FC431 (manufactured by Sumitomo 3M Limited), AsahiGuard [registered trademark] AG710, and Surflon [registered trademark] series S-382, SC101, SC102, SC103, SC104, SC105 and SC106 (manufactured by AGC Inc.), and organosiloxane polymer KP341 (manufactured by Shin-Etsu Chemical Co., Ltd.). The surfactant may be used each alone or in combination of two or more. When the protective film-forming composition includes the surfactant, the content thereof is within the range of 0.0001 to 10% by weight, and preferably 0.01 to 5% by weight of the total solid content in the protective film-forming composition.

Other Components

Other components such as light absorbers, rheology modifiers and adhesion aids may be added to the protective film-forming composition of the present invention. Rheology modifiers are effective for enhancing the fluidity of the protective film-forming composition. Adhesion aids are effective for enhancing the adhesion between an underlayer film and a semiconductor substrate or a resist.

Some examples of a light absorber which may be suitably used are commercially available light absorbers mentioned in "Kougyouyou Shikiso no Gijutsu to Shijou (Technology and Market of Industrial Dyes)" (CMC Publishing Co., Ltd.) and "Senryou Binran (Dye Handbook)" (edited by The Society of Synthetic Organic Chemistry, Japan), such as, for example, C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. Disperse Blue 96; C. I. Fluorescent Brightening Agent 112, 135 and 163; C. I. Solvent Orange 2 and 45; C. I. Solvent Red 1, 3, 8, 23, 24, 25, 27 and 49; C. I. Pigment Green 10; and C. I. Pigment Brown 2.

The light absorber is usually added in a proportion of not more than 10% by mass, and preferably not more than 5% by mass relative to the total solid content in the protective film-forming composition.

The rheology modifier may be added mainly to enhance the fluidity of the protective film-forming composition and thereby, particularly in the baking step, to increase the uniformity in thickness of the resist underlayer film and to enhance the filling performance of the protective film-forming composition with respect to the inside of holes.

Specific examples thereof include phthalic acid derivatives such as dimethyl phthalate, diethyl phthalate, diisobutyl phthalate, dihexyl phthalate and butyl isodecyl phthalate; adipic acid derivatives such as di-n-butyl adipate, diisobutyl adipate, diisooctyl adipate and octyl decyl adipate; maleic acid derivatives such as di-n-butyl maleate, diethyl maleate and dinonyl maleate; oleic acid derivatives such as methyl oleate, butyl oleate and tetrahydrofurfuryl oleate; and stearic acid derivatives such as n-butyl stearate and glyceryl stearate. The rheology modifier is usually added in a proportion of less than 30% by mass relative to the total solid content in the protective film-forming composition.

The adhesion aid may be added mainly to enhance the adhesion between the protective film-forming composition and a substrate or a resist and thereby to prevent the detachment of the resist particularly during development. Specific examples thereof include chlorosilanes such as trimethylchlorosilane, dimethylmethylolchlorosilane, methyldiphenylchlorosilane and chloromethyldimethylchlorosilane; alkoxysilanes such as trimethylmethoxysilane, dimethyldiethoxysilane, methyldimethoxysilane, dimethylmethylolethoxysilane, diphenyldimethoxysilane and phenyltriethoxysilane; silazanes such as hexamethyldisilazane, N,N'-bis(trimethylsilyl)urea, dimethyltrimethylsilylamine and trimethylsilylimidazole; silanes such as methyloltrichlorosilane, γ-chloropropyltrimethoxysilane, γ-aminopropyltriethoxysilane and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole and mercaptopyrimidine; and urea or thiourea compounds such as 1,1-dimethylurea and 1,3-dimethylurea. The adhesion aid is usually added in a proportion of less than 5% by mass, and preferably less than 2% by mass relative to the total solid content in the protective film-forming composition.

Protective Film-Forming Composition

The solid content in the protective film-forming composition of the present invention is usually within the range of 0.1 to 70% by mass, and preferably 0.1 to 60% by mass. The solid content is the proportion of all the components constituting the protective film-forming composition except the solvent. The proportion of the ring-opened polymer in the solid content is within the range of 1 to 100% by mass, 1 to 99.9% by mass, 50 to 99.9% by mass, 50 to 95% by mass, or 50 to 90% by mass in the order of increasing preference.

Protective Film, Method for Producing Resist-Patterned Substrate, and Method for Manufacturing Semiconductor Device The following describes a protective film produced using the protective film-forming composition of the present invention, and a method for producing a resist-patterned substrate and a method for manufacturing a semiconductor device each using the protective film-forming composition of the present invention.

A resist-patterned substrate of the present invention may be produced by applying the protective film-forming composition described hereinabove onto a semiconductor substrate and calcining the composition.

Examples of the semiconductor substrates to which the protective film-forming composition of the present invention is applied include silicon wafers, germanium wafers, and compound semiconductor wafers such as gallium arsenide, indium phosphide, gallium nitride, indium nitride and aluminum nitride.

The semiconductor substrate that is used may have an inorganic film on its surface. For example, such an inorganic film is formed by ALD (atomic layer deposition), CVD (chemical vapor deposition), reactive sputtering, ion plating, vacuum deposition or spin coating (spin on glass: SOG). Examples of the inorganic films include polysilicon films, silicon oxide films, silicon nitride films, BPSG (boro-phospho silicate glass) films, titanium nitride films, titanium oxynitride films, tungsten nitride films, gallium nitride films and gallium arsenide films.

The protective film-forming composition of the present invention is applied onto such a semiconductor substrate with an appropriate applicator such as a spinner or a coater. Thereafter, the composition is baked with a heating device such as a hot plate to form a protective film. The baking conditions are appropriately selected from a baking temperature within the range of 100° C. to 400° C. and an amount of baking time within the range of 0.3 minutes to 60 minutes. Preferably, the baking temperature is within the range of 120° C. to 350° C. and the baking time is within the range of 0.5 minutes to 30 minutes. More preferably, the baking temperature is within the range of 150° C. to 300° C. and the baking time is within the range of 0.8 minutes to 10 minutes. The thickness of the protective film formed is, for example, within the range of 0.001 μm to 10 μm, preferably 0.002 μm to 1 μm, and more preferably 0.005 μm to 0.5 μm. If the baking temperature is lower than the range mentioned above, the composition may be crosslinked insufficiently and may give a protective film that is poorly resistant to a resist solvent or a basic aqueous hydrogen peroxide solution. If, on the other hand, the baking temperature is higher than the above range, the protective film may be decomposed by heat.

Photoexposure is performed using, for example, i-line radiation, KrF excimer laser beam, ArF excimer laser beam, EUV (extreme ultraviolet ray) or EB (electron beam) through a mask (a reticle) designed to form a predetermined pattern. An alkaline developer is used for the development, and the conditions are appropriately selected from a development temperature within the range of 5° C. to 50° C. and an amount of development time within the range of 10 seconds to 300 seconds. Examples of the alkaline developers include aqueous solutions of alkalis such as inorganic alkalis including sodium hydroxide, potassium hydroxide, sodium carbonate, sodium silicate, sodium metasilicate and aqueous ammonia, primary amines including ethylamine and n-propylamine, secondary amines including diethylamine and di-n-butylamine, tertiary amines including triethylamine and methyldiethylamine, alcohol amines including dimethylethanolamine and triethanolamine, quaternary ammonium salts including tetramethylammonium hydroxide, tetraethylammonium hydroxide and choline, and cyclic amines including pyrrole and piperidine. Also, an alcohol such as isopropyl alcohol and a surfactant such as nonionic surfactants may be added each in an appropriate amount to the aqueous alkali solutions described above. Of the developers mentioned above, a quaternary ammonium salt is preferable, and tetramethylammonium hydroxide and choline are more preferable. Additional components such as surfactant may be added to the developer. An organic solvent such as butyl acetate may be used in place of the alkali developer to develop portions of the photoresist that remain low in alkali dissolution rate.

Next, the protective film is dry-etched using the thus-formed resist pattern as a mask. When the inorganic film described above is present on the surface of the semiconductor substrate that is used, the etching process exposes the surface of the inorganic film. When there is no inorganic film on the surface of the semiconductor substrate that is used, the etching process exposes the surface of the semiconductor substrate.

Further, the semiconductor substrate is wet-etched with a semiconductor wet etchant through the dry-etched protective film (and also through the resist pattern when the resist pattern remains on the protective film) as a mask, thereby forming a desired pattern.

Semiconductor Wet Etchant

The semiconductor wet etchant may be any general chemical liquid capable of etching a semiconductor wafer. For example, acidic substances and basic substances may be used.

Examples of the acidic substances include hydrogen peroxide, hydrofluoric acid, ammonium fluoride, acidic ammonium fluoride, ammonium hydrogen fluoride, buffered hydrofluoric acid, hydrochloric acid, nitric acid, sulfuric acid, phosphoric acid, and mixtures thereof. Specific examples include SC-2 (hydrochloric acid-hydrogen peroxide solution).

Examples of the basic substances include ammonia, sodium hydroxide, potassium hydroxide, sodium cyanide, potassium cyanide, and basic hydrogen peroxide solutions obtained by mixing an organic amine such as triethanolamine with a hydrogen peroxide solution while maintaining the pH basic. Specific examples include SC-1 (ammonia-hydrogen peroxide solution). Examples of the wet etchants further include those chemicals which may be rendered basic, for example, a mixture of urea and a hydrogen peroxide solution which upon heating generates ammonia by the thermal decomposition of urea and finally achieves a basic pH.

Of these, an acidic hydrogen peroxide solution and basic hydrogen peroxide solution are preferable.

The chemical liquids described above may include additives such as surfactant.

The semiconductor wet etchant is desirably used at a temperature within the range of 25° C. to 90° C., and more desirably 40° C. to 80° C. The amount of wet etching time is desirably within the range of 0.5 minutes to 30 minutes, and more desirably 1 minute to 20 minutes.

EXAMPLES

The present invention will be described in greater detail with reference to Examples and other experiments hereinbelow. However, it should not be construed that the present invention is limited to such Examples and experiments.

Polymers obtained in Synthetic Examples below were analyzed to measure the weight average molecular weight using the apparatus and conditions described below.
Apparatus: HLC-8320GPC manufactured by TOSOH CORPORATION
GPC columns: Shodex [registered trademark]/Asahipak [registered trademark] (SHOWA DENKO K.K.)
Column temperature: 40° C.
Flow rate: 0.35 mL/min
Eluent: Tetrahydrofuran (THF)
Standard samples: Polystyrenes (TOSOH CORPORATION)

Synthetic Example 1

A dropping funnel was loaded with a solution of 3.0 g of glycerin monomethacrylate (product name: BLEMMER GLM, manufactured by NOF CORPORATION), 4.6 g of 5-vinylbenzo[d][1,3]dioxole (manufactured by Cool Pharm LTD.), 1.4 g of N-isopropylacrylamide (manufactured by Tokyo Chemical Industry Co., Ltd.), and 0.7 g of dimethyl 2,2'-azobis(isobutyrate) (manufactured by Wako Pure Chemical Industries, Ltd.) in 31.2 g of propylene glycol monomethyl ether. The solution was dropped into a reaction flask containing 7.8 g of propylene glycol monomethyl ether in a nitrogen atmosphere at 100° C., and the mixture was stirred while heating for 24 hours. To the resultant solution were added 9.8 g of an anion exchange resin (product name: Dowex [registered trademark] 550A, manufactured by Muromachi Technos Co., Ltd.) and 9.8 g of a cation exchange resin (product name: Amberlite [registered trademark] 15JWET, ORGANO CORPORATION). Ion exchange treatment was performed at room temperature for 4 hours. Removing the ion exchange resins gave a resin solution corresponding to formula (P-1). The weight average molecular weight (Mw) in terms of polystyrene determined by GPC was 6,819.

[Chem. 63]

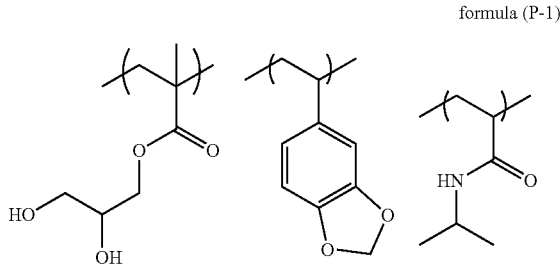

formula (P-1)

Example 1

A solution of a protective film-forming composition was prepared by adding 0.06 g of pyridinium trifluoromethanesulfonic acid (manufactured by ADEKA CORPORATION) as a crosslinking acid catalyst, 0.001 g of a surfactant (product name: MEGAFACE [trade name] R-40, manufactured by DIC CORPORATION, fluorosurfactant), 10.4 g of propylene glycol monomethyl ether and 1.9 g of propylene glycol monomethyl ether acetate to 7.6 g of the resin solution (solid content: 15.0% by weight) obtained in Synthetic Example 1.

Synthetic Example 2

A dropping funnel was loaded with a solution of 2.5 g of glycerin monomethacrylate (product name: BLEMMER GLM, manufactured by NOF CORPORATION), 3.9 g of 5-vinylbenzo[d][1,3]dioxole (manufactured by Cool Pharm LTD.), 2.5 g of 2-(O-[1'-methylpropylideneamino]carboxyamino)ethyl methacrylate (trade name: Karenz [registered trademark] MOI-BM, manufactured by SHOWA DENKO K.K.), and 0.6 g of dimethyl 2,2'-azobis(isobutyrate) (manufactured by Wako Pure Chemical Industries, Ltd.) in 30.3 g of propylene glycol monomethyl ether. The solution was dropped into a reaction flask containing 7.6 g of propylene glycol monomethyl ether in a nitrogen atmosphere at 100° C., and the mixture was stirred while heating for 24 hours. To the resultant solution were added 9.5 g of an anion exchange resin (product name: Dowex [registered trademark] 550A, manufactured by Muromachi Technos Co., Ltd.) and 9.5 g of a cation exchange resin (product name: Amberlite [registered trademark] 15JWET, ORGANO CORPORATION). Ion exchange treatment was performed at room temperature for 4 hours. Removing the ion exchange resins gave a resin solution corresponding to formula (P-2). The weight average molecular weight (Mw) in terms of polystyrene determined by GPC was 17,108.

[Chem. 64]

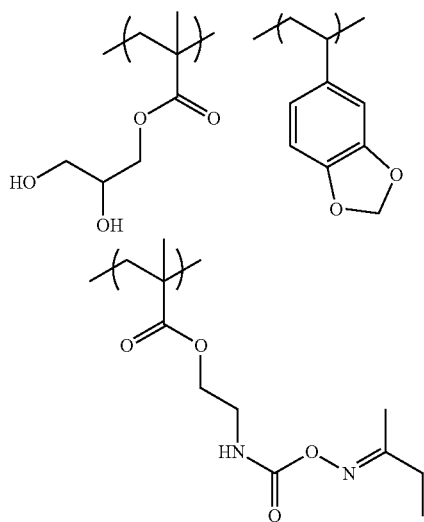

formula (P-2)

Example 2

A solution of a protective film-forming composition was prepared by adding 0.06 g of pyridinium trifluoromethanesulfonic acid (manufactured by ADEKA CORPORATION) as a crosslinking acid catalyst, 0.001 g of a surfactant (product name: MEGAFACE [trade name] R-40, manufactured by DIC CORPORATION, fluorosurfactant), 11.4 g of propylene glycol monomethyl ether and 1.9 g of propylene glycol monomethyl ether acetate to 6.6 g of the resin solution (solid content: 17.3% by weight) obtained in Synthetic Example 2.

Synthetic Example 3

A dropping funnel was loaded with a solution of 3.0 g of glycerin monomethacrylate (product name: BLEMMER GLM, manufactured by NOF CORPORATION), 4.6 g of 5-vinylbenzo[d][1,3]dioxole (manufactured by Cool Pharm LTD.), 1.6 g of N-(methoxymethyl)methacrylamide (manufactured by Wako Pure Chemical Industries, Ltd.), and 0.7 g of dimethyl 2,2'-azobis(isobutyrate) (manufactured by Wako Pure Chemical Industries, Ltd.) in 31.9 g of propylene glycol monomethyl ether. The solution was dropped into a reaction flask containing 8.0 g of propylene glycol monomethyl ether in a nitrogen atmosphere at 100° C., and the mixture was stirred while heating for 24 hours. To the resultant solution were added 10.0 g of an anion exchange resin (product name: Dowex [registered trademark] 550A, manufactured by Muromachi Technos Co., Ltd.) and 10.0 g of a cation exchange resin (product name: Amberlite [registered trademark] 15JWET, ORGANO CORPORATION). Ion exchange treatment was performed at room temperature for 4 hours. Removing the ion exchange resins gave a resin solution corresponding to formula (P-3). The weight average molecular weight (Mw) in terms of polystyrene determined by GPC was 6,622.

[Chem. 65]

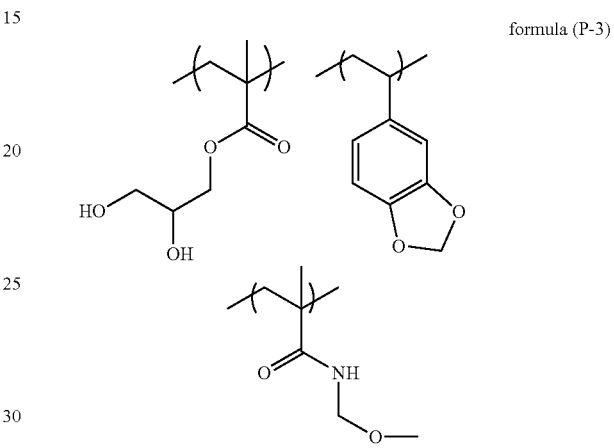

formula (P-3)

Example 3

A solution of a protective film-forming composition was prepared by adding 0.06 g of pyridinium trifluoromethanesulfonic acid (manufactured by ADEKA CORPORATION) as a crosslinking acid catalyst, 0.001 g of a surfactant (product name: MEGAFACE [trade name] R-40, manufactured by DIC CORPORATION, fluorosurfactant), 10.7 g of propylene glycol monomethyl ether and 1.9 g of propylene glycol monomethyl ether acetate to 7.4 g of the resin solution (solid content: 15.5% by weight) obtained in Synthetic Example 3.

Synthetic Example 4

A dropping funnel was loaded with a solution of 3.0 g of glycerin monomethacrylate (product name: BLEMMER GLM, manufactured by NOF CORPORATION), 4.6 g of 5-vinylbenzo[d][1,3]dioxole (manufactured by Cool Pharm LTD.), 1.26 g of N-(hydroxymethyl)acrylamide (manufactured by Tokyo Chemical Industry Co., Ltd.), and 0.7 g of dimethyl 2,2'-azobis(isobutyrate) (manufactured by Wako Pure Chemical Industries, Ltd.) in 30.7 g of propylene glycol monomethyl ether. The solution was dropped into a reaction flask containing 7.7 g of propylene glycol monomethyl ether in a nitrogen atmosphere at 100° C., and the mixture was stirred while heating for 24 hours. To the resultant solution were added 9.6 g of an anion exchange resin (product name: Dowex [registered trademark] 550A, manufactured by Muromachi Technos Co., Ltd.) and 9.6 g of a cation exchange resin (product name: Amberlite [registered trademark] 15JWET, ORGANO CORPORATION). Ion exchange treatment was performed at room temperature for 4 hours. Removing the ion exchange resins gave a resin solution corresponding to formula (P-4). The weight average molecular weight (Mw) in terms of polystyrene determined by GPC was 5,450.

[Chem. 66]

formula (P-4)

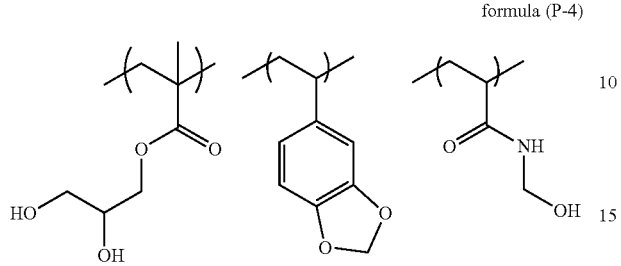

Example 4

A solution of a protective film-forming composition was prepared by adding 0.06 g of pyridinium trifluoromethanesulfonic acid (manufactured by ADEKA CORPORATION) as a crosslinking acid catalyst, 0.001 g of a surfactant (product name: MEGAFACE [trade name] R-40, manufactured by DIC CORPORATION, fluorosurfactant), 11.2 g of propylene glycol monomethyl ether and 1.9 g of propylene glycol monomethyl ether acetate to 6.9 g of the resin solution (solid content: 16.5% by weight) obtained in Synthetic Example 4.

Synthetic Example 5

A dropping funnel was loaded with a solution of 5.50 g of glycerin monomethacrylate (product name: BLEMMER GLM, manufactured by NOF CORPORATION), 5.09 g of 5-vinylbenzo[d][1,3]dioxole (manufactured by Cool Pharm LTD.), and 0.66 g of 2,2'-azobis(isobutyronitrile) (manufactured by Tokyo Chemical Industry Co., Ltd.) in 35.99 g of propylene glycol monomethyl ether. The solution was dropped into a reaction flask containing 9.00 g of propylene glycol monomethyl ether in a nitrogen atmosphere at 100° C., and the mixture was stirred while heating for 17 hours. To the resultant solution were added 11 g of an anion exchange resin (product name: Dowex [registered trademark] 550A, manufactured by Muromachi Technos Co., Ltd.) and 11 g of a cation exchange resin (product name: Amberlite [registered trademark] 15JWET, ORGANO CORPORATION). Ion exchange treatment was performed at room temperature for 4 hours. Removing the ion exchange resins gave a resin solution corresponding to formula (X-1). The weight average molecular weight (Mw) in terms of polystyrene determined by GPC was 10,800.

[Chem. 67]

formula (X-1)

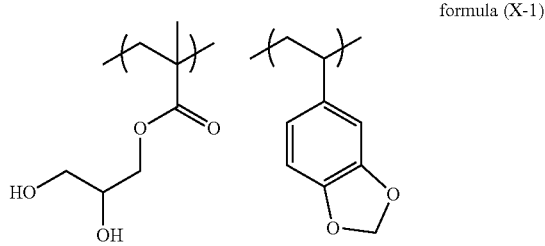

Comparative Example 1

A solution of a protective film-forming composition was prepared by adding 0.06 g of pyridinium trifluoromethanesulfonic acid (manufactured by ADEKA CORPORATION) as a crosslinking acid catalyst, 0.001 g of a surfactant (product name: MEGAFACE [trade name] R-40, manufactured by DIC CORPORATION, fluorosurfactant), 11.5 g of propylene glycol monomethyl ether and 1.9 g of propylene glycol monomethyl ether acetate to 6.6 g of the resin solution (solid content: 17.4% by weight) obtained in Synthetic Example 5.

Test of Resistance to Resist Solvents

With a spin coater, the protective film-forming compositions prepared in Examples 1 to 4 and Comparative Example 1 were each applied (spin coated) onto a silicon wafer. Each of the coated silicon wafers was heated on a hot plate at 215° C. for 1 minute to form a coating (a protective film) having a film thickness of 100 nm. Next, in order to examine the resist solvent resistance of the protective film, each of the silicon wafers bearing the protective film was immersed for 1 minute in a solvent containing propylene glycol monomethyl ether and propylene glycol monomethyl ether acetate mixed in a weight ratio of 7:3, thereafter spin-dried and baked at 100° C. for 30 seconds. The thickness of the protective film before and after the immersion in the mixed solvent was measured with an optical interference thickness meter.

The resist solvent resistance was evaluated by calculating the thickness loss (%) of the protective film after solvent immersion using the equation: ((film thickness before solvent immersion)−(film thickness after solvent immersion)) ÷(film thickness before solvent immersion)×100. Approximately 1% or less thickness loss is acceptable.

TABLE 1

|  | Thickness loss |
|---|---|
| Example 1 | 0.1% |
| Example 2 | 0.4% |
| Example 3 | 0.2% |
| Example 4 | 0.2% |
| Comparative Example 1 | 0.8% |

From the above results, the films obtained in Examples 1 to 4 and Comparative Example 1 had a very small change in film thickness after immersion in the resist solvent, and exhibited good resist solvent resistance. The films from these examples were thus shown to have a sufficient resistance to resist solvents to function as a protective film.

Test of Resistance to Basic Hydrogen Peroxide Solution

To evaluate the resistance to a basic hydrogen peroxide solution, the protective film-forming compositions from Examples 1 to 4 and Comparative Example 1, which showed a good resist solvent resistance in the above test of resistance to resist solvents, were each applied to a 50 nm thick TiN-deposited substrate and heated at 215° C. for 1 minute to form a film having a film thickness of 100 nm. Next, 28% aqueous ammonia, 33% hydrogen peroxide and water were mixed together in a weight ratio of 1:1:2 to give a basic hydrogen peroxide solution. The TiN-deposited substrate coated with each of the protective film-forming compositions was immersed in this basic hydrogen peroxide solution heated to 50° C., and the time was measured from immediately after the start of immersion until the separation of the protective film from the substrate. The results are shown in Table 2.

TABLE 2

| | Time to separation (relative to Comparative Example 1) |
|---|---|
| Example 1 | 1.0 |
| Example 2 | 1.0 |
| Example 3 | not less than 1.6 |
| Example 4 | 1.1 |
| Comparative Example | 1.0 |

From the above results, the coating films of Examples 3 and 4 resisted separation from the substrate in the presence of the basic hydrogen peroxide solution for a longer period of time than the coating film of Comparative Example 1. That is, the coating films of Examples 3 and 4 exhibited a higher chemical resistance to the basic hydrogen peroxide solution than the coating film of Comparative Example 1, and were thus shown to be useful as a protective film against basic hydrogen peroxide solutions.

Test of Resistance to Acidic Hydrogen Peroxide Solution

To evaluate the resistance to an acidic hydrogen peroxide solution, the protective film-forming compositions from Examples 1 to 4 and Comparative Example 1, which showed a good resist solvent resistance in the above resist solvent resistance test, were each applied to a 50 nm thick TiN-deposited substrate and heated at 215° C. for 1 minute to form a film having a film thickness of 100 nm. Next, 85% phosphoric acid and 35% hydrogen peroxide were mixed together in a weight ratio of 1:1 to give an acidic hydrogen peroxide solution. The TiN-deposited substrate coated with each of the protective film-forming compositions was immersed in this acidic hydrogen peroxide solution heated to 60° C., and the time was measured from immediately after the start of immersion until the separation of the protective film from the substrate. The results are shown in Table 3.

TABLE 3

| | Time to separation |
|---|---|
| Example 1 | At least 15 minutes |
| Example 2 | At least 15 minutes |
| Example 3 | At least 15 minutes |
| Example 4 | At least 15 minutes |
| Comparative Example 1 | Less than 10 minutes |

INDUSTRIAL APPLICABILITY

According to the present invention, there is provided a composition for forming a protective film excellent in resistance to a semiconductor wet etchant in a lithography process in semiconductor manufacturing.

The invention claimed is:

1. A protective film-forming composition for forming a protective film against a semiconductor wet etchant, the composition comprising a solvent, and a component that is a compound or polymer containing at least one acetal structure and at least one amide structure, wherein the at least one acetal structure comprises a structure represented by formula (1):

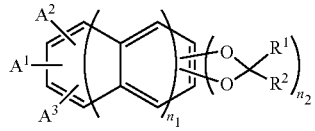

formula (1)

wherein in formula (1), $R^1$ and $R^2$ are the same as or different from each other and are each a hydrogen atom, or a C1-C10 alkyl or C6-C40 aryl group optionally substituted with a monovalent organic group (A), $n_1$ is 0, 1 or 2, $n_2$ is 1 or 2, $A^1$ denotes a hydrogen atom or a hydroxy group, $A^2$ denotes a —CH($R^0$)-$A^4$ group, $R^0$ denotes a hydrogen atom, a phenyl group optionally substituted with 1 to 3 hydroxy groups, or a benzodioxole group, and $A^3$ and $A^4$ each denote an identical or different monovalent organic group (A-1).

2. The protective film-forming composition according to claim 1, wherein the component is the polymer, and the polymer is a copolymer of a compound (a) containing the at least one acetal structure in the molecule and represented by the structure of formula (1) and a compound (b) containing the at least one amide structure in the molecule.

3. The protective film-forming composition according to claim 1, wherein the at least one acetal structure is a structure that protects adjacent hydroxy groups in an aromatic group.

4. The protective film-forming composition according to claim 1, wherein at least one amide structure comprises a structure represented by —CO—NH— or —CO—N=.

5. The protective film-forming composition according to claim 2, wherein the compound (b) is represented by formula (2):

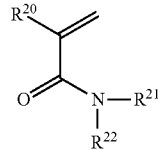

formula (2)

wherein in formula (2), $R^{20}$ denotes a hydrogen atom or a methyl group, and $R^{21}$ and $R^{22}$ are the same as or different from each other and are each a hydrogen atom, or a C1-C10 alkyl or C6-C40 aryl group optionally substituted with a monovalent organic group (B) and optionally interrupted by an oxygen atom or a quaternary ammonium cation).

6. The protective film-forming composition according to claim 5, wherein the monovalent organic group (B) is selected from the group consisting of a hydroxy group, a cyano group, a sulfo group, a carboxylate group, a boron atom optionally substituted with one or two hydroxy groups, an optionally halogenated C1-C6 alkyl group, and an —NR$^{a1}$R$^{b1}$ group in which R$^{a1}$ and R$^{b1}$ are the same as or different from each other and each denote a hydrogen atom or a C1-C3 alkyl group.

7. The protective film-forming composition according to claim 2, wherein the compound (b) is represented by formula (2-1):

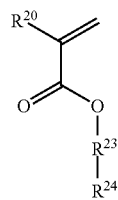

formula (2-1)

wherein in formula (2-1), R$^{20}$ denotes a hydrogen atom or a methyl group, R$^{23}$ denotes a C1-C5 alkylene group, and R$^{24}$ denotes a blocked isocyanate group).

8. The protective film-forming composition according to claim 1, further comprising a crosslinking catalyst.

9. The protective film-forming composition according to claim 1, further comprising a crosslinking agent.

10. The protective film-forming composition according to claim 1, further comprising a surfactant.

11. A protective film, which is a calcined product of a coating film comprising the protective film-forming composition according to claim 1.

12. A method for producing a resist-patterned substrate, which is used for manufacture of a semiconductor, comprising applying the protective film composition according to claim 1 onto a semiconductor substrate and calcining the composition to form a protective film as a resist underlayer film.

13. A method for manufacturing a semiconductor device, comprising
forming a protective film against a semiconductor wet etchant with the protective film-forming composition according to claim 1 on a semiconductor substrate optionally having an inorganic film formed on a surface thereof,
forming a resist pattern on the protective film,
dry-etching the protective film through the resist pattern as a mask to expose a surface of the inorganic film or of the semiconductor substrate, and
wet-etching the inorganic film or the semiconductor substrate with a semiconductor wet etchant through the dry-etched protective film as a mask, and cleaning the semiconductor substrate.

* * * * *